United States Patent
Koshiishi et al.

(10) Patent No.: US 10,529,539 B2
(45) Date of Patent: *Jan. 7, 2020

(54) PLASMA PROCESSING APPARATUS AND METHOD

(71) Applicant: TOKYO ELECTRON LIMITED, Minato-ku (JP)

(72) Inventors: Akira Koshiishi, Nirasaki (JP); Masaru Sugimoto, Nirasaki (JP); Kunihiko Hinata, Nirasaki (JP); Noriyuki Kobayashi, Nirasaki (JP); Chishio Koshimizu, Nirasaki (JP); Ryuji Ohtani, Nirasaki (JP); Kazuo Kibi, Nirasaki (JP); Masashi Saito, Nirasaki (JP); Naoki Matsumoto, Nirasaki (JP); Manabu Iwata, Nirasaki (JP); Daisuke Yano, Minami-Alps (JP); Yohei Yamazawa, Nirasaki (JP); Hidetoshi Hanaoka, Nirasaki (JP); Toshihiro Hayami, Nirasaki (JP); Hiroki Yamazaki, Nirasaki (JP); Manabu Sato, Nirasaki (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 181 days.

This patent is subject to a terminal disclaimer.

(21) Appl. No.: 15/290,846

(22) Filed: Oct. 11, 2016

(65) Prior Publication Data

US 2017/0032936 A1    Feb. 2, 2017

Related U.S. Application Data

(63) Continuation of application No. 13/113,330, filed on May 23, 2011, now abandoned, which is a
(Continued)

(30) Foreign Application Priority Data

Jun. 21, 2004 (JP) .............................. 2004-183093
Jan. 21, 2005 (JP) .............................. 2005-013912
Feb. 22, 2005 (JP) .............................. 2005-045095

(51) Int. Cl.
*C23F 1/00* (2006.01)
*H01L 21/306* (2006.01)
(Continued)

(52) U.S. Cl.
CPC .... *H01J 37/32091* (2013.01); *H01J 37/3244* (2013.01); *H01J 37/32082* (2013.01);
(Continued)

(58) Field of Classification Search
USPC ..................................................... 156/345.44
See application file for complete search history.

(56) References Cited

U.S. PATENT DOCUMENTS 3,477,935 A    11/1969 Hall
4,333,814 A    6/1982 Kuyel
(Continued)

FOREIGN PATENT DOCUMENTS

CN    1228196 A    9/1999
CN    1459125 A    11/2003
(Continued)

OTHER PUBLICATIONS

Korean Office Action dated Jun. 29, 2011 in Patent Application No. 10-2006-7026949 (with English translation).
(Continued)

*Primary Examiner* — Keath T Chen
(74) *Attorney, Agent, or Firm* — Oblon, McClelland, Maier & Neustadt, L.L.P.

(57) ABSTRACT

An apparatus includes an upper electrode and a lower electrode for supporting a wafer disposed opposite each
(Continued)

other within a process chamber. A first RF power supply configured to apply a first RF power having a relatively higher frequency, and a second RF power supply configured to apply a second RF power having a relatively lower frequency is connected to the lower electrode. A variable DC power supply is connected to the upper electrode. A process gas is supplied into the process chamber to generate plasma of the process gas so as to perform plasma etching.

8 Claims, 26 Drawing Sheets

Related U.S. Application Data continuation of application No. 11/156,561, filed on Jun. 21, 2005, now Pat. No. 7,951,262.

(60) Provisional application No. 60/589,831, filed on Jul. 22, 2004, provisional application No. 60/650,957, filed on Feb. 9, 2005, provisional application No. 60/662,344, filed on Mar. 17, 2005.

(51) Int. Cl.
  H01J 37/32      (2006.01)
  H01L 21/3065    (2006.01)

(52) U.S. Cl.
  CPC .. *H01J 37/32174* (2013.01); *H01J 37/32697* (2013.01); *H01J 37/32706* (2013.01); *H01L 21/3065* (2013.01); *H01J 2237/334* (2013.01)

(56) References Cited

U.S. PATENT DOCUMENTS

| | | | |
|---|---|---|---|
| 4,496,448 A | 1/1985 | Tai et al. |
| 4,512,283 A | 4/1985 | Bonifield et al. |
| 4,812,712 A | 3/1989 | Ohnishi et al. |
| 4,816,638 A | 3/1989 | Ukai et al. |
| 5,102,496 A | 4/1992 | Savas |
| 5,110,438 A | 5/1992 | Ohmi et al. |
| 5,405,491 A | 4/1995 | Shahvandi et al. |
| 5,451,754 A | 9/1995 | Reale |
| 5,569,350 A | 10/1996 | Osada et al. |
| 5,573,597 A | 11/1996 | Lantsman |
| 5,661,093 A | 8/1997 | Ravi et al. |
| 5,721,021 A | 2/1998 | Tobe et al. |
| 5,812,361 A | 9/1998 | Jones et al. |
| 5,891,348 A | 4/1999 | Ye et al. |
| 5,919,332 A | 7/1999 | Koshiishi et al. |
| 5,968,379 A | 10/1999 | Zhao et al. |
| 6,048,435 A | 4/2000 | DeOrnellas |
| 6,074,518 A | 6/2000 | Imafuku et al. |
| 6,110,287 A | 8/2000 | Arai et al. |
| 6,187,685 B1 | 2/2001 | Hopkins et al. |
| 6,214,162 B1 | 4/2001 | Koshimizu |
| 6,221,221 B1 | 4/2001 | Al-Shaikh et al. |
| 6,222,321 B1 | 4/2001 | Scholl et al. |
| 6,239,403 B1 | 5/2001 | Dible |
| 6,261,408 B1 | 7/2001 | Schneider et al. |
| 6,287,943 B1 | 9/2001 | Fujioka et al. |
| 6,333,272 B1 | 12/2001 | McMillin |
| 6,504,307 B1 | 1/2003 | Malik et al. |
| 6,554,979 B2 | 4/2003 | Stimson |
| 6,617,255 B2 | 9/2003 | Arase |
| 6,635,117 B1 | 10/2003 | Kinnard et al. |
| 6,663,748 B2 | 12/2003 | Kodama |
| 6,744,212 B2 | 6/2004 | Fischer et al. |
| 6,805,779 B2 | 10/2004 | Chistyakov |
| 6,878,234 B2 | 4/2005 | Ogasawara et al. |
| 7,022,616 B2 | 4/2006 | Mimura et al. |
| 7,141,504 B1 | 11/2006 | Bhardwaj |
| 7,415,940 B2 | 8/2008 | Koshimizu et al. |
| 7,537,672 B1 | 5/2009 | Koshiishi et al. |
| 7,601,241 B2 | 10/2009 | Tetsuka et al. |
| 7,740,737 B2 | 6/2010 | Koshiishi et al. |
| 7,951,262 B2 | 5/2011 | Koshiishi |
| 7,988,816 B2 | 8/2011 | Koshiishi et al. |
| 8,080,126 B2 | 12/2011 | Koshiishi et al. |
| 8,137,471 B2 | 3/2012 | Koshiishi |
| 8,603,293 B2 | 12/2013 | Koshiishi |
| 2001/0009139 A1 | 7/2001 | Shan et al. |
| 2001/0022293 A1 | 9/2001 | Maeda et al. |
| 2001/0035132 A1 | 11/2001 | Kent et al. |
| 2001/0037770 A1 | 11/2001 | Otsubo |
| 2002/0005252 A1 | 1/2002 | Masuda et al. |
| 2002/0061654 A1 | 5/2002 | Kanegae et al. |
| 2002/0103563 A1 | 8/2002 | Izawa et al. |
| 2002/0134308 A1 | 9/2002 | Amano |
| 2002/0139665 A1 | 10/2002 | Deornellas et al. |
| 2003/0029567 A1 | 2/2003 | Dhindsa et al. |
| 2003/0086840 A1 | 5/2003 | Himori et al. |
| 2003/0094135 A1 | 5/2003 | Komiya et al. |
| 2003/0129835 A1 | 7/2003 | Kholodenko et al. |
| 2003/0148611 A1 | 8/2003 | Dhindsa et al. |
| 2003/0164142 A1 | 9/2003 | Koshimizu |
| 2003/0164226 A1 | 9/2003 | Kanno et al. |
| 2004/0025791 A1 | 2/2004 | Chen et al. |
| 2004/0097079 A1 | 5/2004 | Mimura et al. |
| 2004/0106293 A1 | 6/2004 | Igarashi |
| 2004/0112536 A1 | 6/2004 | Quon |
| 2004/0112540 A1 | 6/2004 | Larson |
| 2004/0149216 A1 | 8/2004 | Osada et al. |
| 2004/0261946 A1 | 12/2004 | Endoh et al. |
| 2005/0039773 A1* | 2/2005 | Moriya ............... C23C 16/4401 134/1.2 |
| 2005/0051273 A1 | 3/2005 | Maeda et al. |
| 2005/0103275 A1 | 5/2005 | Sasaki et al. |
| 2005/0103442 A1 | 5/2005 | Chen et al. |
| 2005/0112879 A1 | 5/2005 | Fujimoto et al. |
| 2005/0145176 A1 | 7/2005 | Wicker |
| 2005/0164513 A1 | 7/2005 | Deornellas et al. |
| 2005/0172904 A1 | 8/2005 | Koshimizu et al. |
| 2005/0205412 A1 | 9/2005 | Rohrmann |
| 2005/0257743 A1 | 11/2005 | Koshiishi et al. |
| 2005/0264219 A1 | 12/2005 | Dhindsa et al. |
| 2006/0019031 A1 | 1/2006 | Furuta et al. |
| 2006/0043067 A1 | 3/2006 | Kadkhodayan et al. |
| 2006/0086458 A1 | 4/2006 | Kim et al. |
| 2008/0308041 A1 | 12/2008 | Koshiishi et al. |

FOREIGN PATENT DOCUMENTS

| | | |
|---|---|---|
| CN | 1461494 A | 12/2003 |
| CN | 1585997 A | 2/2005 |
| EP | 1193746 | 3/2002 |
| EP | 1 446 825 A1 | 8/2004 |
| JP | 60-245213 A | 12/1985 |
| JP | 61-199078 A | 9/1986 |
| JP | 63-253628 A | 10/1988 |
| JP | 1-183123 A | 7/1989 |
| JP | 2-183533 A | 7/1990 |
| JP | A 04-279044 | 5/1992 |
| JP | 4-315797 A | 11/1992 |
| JP | 6-124998 | 5/1994 |
| JP | 6-279044 A | 10/1994 |
| JP | 6-333849 | 12/1994 |
| JP | 6-338476 | 12/1994 |
| JP | 7-207471 A | 8/1995 |
| JP | 7-211489 A | 8/1995 |
| JP | 7-254588 A | 10/1995 |
| JP | 8-124902 A | 5/1996 |
| JP | 8-172034 | 7/1996 |
| JP | 08-264515 | 10/1996 |
| JP | 8-319588 | 12/1996 |
| JP | 9-326383 | 12/1997 |
| JP | 10-12597 | 1/1998 |
| JP | 11-106916 A | 4/1999 |
| JP | 2000-36490 A | 2/2000 |
| JP | 2000-40695 A | 2/2000 |
| JP | 2000-164583 | 6/2000 |
| JP | 2000-173993 | 6/2000 |
| JP | 2000-299198 | 10/2000 |

(56) References Cited

FOREIGN PATENT DOCUMENTS

| | | |
|---|---|---|
| JP | 2000-306891 A | 11/2000 |
| JP | 2000-323460 | 11/2000 |
| JP | 2000-323460 A | 11/2000 |
| JP | 2000-328248 A | 11/2000 |
| JP | 2001-210627 A | 8/2001 |
| JP | 2001-308080 | 11/2001 |
| JP | 2002-16126 | 1/2002 |
| JP | 2002-110650 | 4/2002 |
| JP | 2002-270586 | 9/2002 |
| JP | 2003-077896 A | 3/2003 |
| JP | 2003-264170 | 9/2003 |
| JP | 2004-087875 | 3/2004 |
| JP | 2004-95663 | 3/2004 |
| JP | 2004-515910 | 5/2004 |
| JP | 2004-165460 | 6/2004 |
| JP | 2006-501631 A | 1/2006 |
| JP | 2010-50485 A | 3/2010 |
| JP | 4750359 B2 | 8/2011 |
| JP | 4831853 B2 | 12/2011 |
| JP | 5546216 B2 | 7/2014 |
| KR | 10-2005-0044437 A | 5/2005 |
| KR | 10-2009-0125217 A | 12/2009 |
| TW | 200305354 A | 10/2003 |
| TW | I271124 B | 1/2007 |
| WO | WO 00/68985 A1 | 11/2000 |
| WO | WO 02/27755 A2 | 4/2002 |
| WO | WO 02/093631 A1 | 11/2002 |
| WO | WO 02/097855 A1 | 12/2002 |
| WO | WO 03/043061 A1 | 5/2003 |
| WO | WO 03/068442 A1 | 8/2003 |
| WO | WO 2004/049420 A1 | 6/2004 |

OTHER PUBLICATIONS

Japanese Office Action dated Mar. 27, 2012 in Patent Application No. 2011-8112 (with English translation).
Office Action dated Aug. 28, 2012 in co-pending U.S. Appl. No. 13/113,330.
Chinese Office Action and Search Report dated Jul. 19, 2013 in Patent Application No. 201110206223.X (with English translation of categories of cited documents).
Office Action dated Sep. 6, 2013 in co-pending U.S. Appl. No. 13/113,330.
Taiwanese Office Action and Search Report dated Apr. 9, 2015 in Patent Application No. 102126893 (with English translation of categories of cited documents).
Office Action dated Nov. 30, 2015 in co-pending U.S. Appl. No. 14/070,190.
Office Action dated Nov. 5, 2010 in co-pending U.S. Appl. No. 11/157,061.
Office Action dated Sep. 18, 2009 in co-pending U.S. Appl. No. 11/157,061.
Chinese Office Action dated Apr. 13, 2010, in Patent Application No. 200710004236.2 (with English-language translation).
Office Action dated Sep. 7, 2010 in JP Application No. 2005-181131 (With English Translation).
Office Action dated Sep. 7, 2010 in JP Application No. 2005-181132 (With English Translation).
Office Action dated Sep. 7, 2010 in JP Application No. 2005-181133 (with English Translation).
Korean Office Action dated Feb. 22, 2012, in Korea Patent Application No. 2006-7026949 (with English translation).
Office Action dated Mar. 27, 2012, in Japanese Patent Application No. 2005-181132 with English translation.
Office Action dated Feb. 19, 2013, in Japanese Patent Application No. 2010-249961.
Office Action dated Feb. 19, 2013, in Japanese Patent Application No. 2010-249962.
Combined Office Action and Search Report dated Feb. 23, 2013, in Taiwanese Patent Application No. 094120663.
Office Action issued in corresponding Japanese Application No. 2010-249961 dated Aug. 20, 2013.
Office Action dated May 20, 2014 in corresponding Japanese Patent Application No. 2013-089519.
Combined Chinese Office Action and Search Report dated May 29, 2013 in Patent Application No. 201110206176.9 (with partial English language translation and English translation of categories of cited documents).
Chinese Office Action dated Jun. 3, 2013 in Patent Application No. 201110206202.8.
Chinese Office Action dated Jul. 17, 2013 in Patent Application No. 201110206125.6.
Combined Chinese Office Action and Search Report dated Jul. 22, 2013 in Patent Application No. 201110206162.7 (with English translation of categories of cited documents).
Extended European Search Report dated Jul. 29, 2014 in corresponding European Application No. 12159425.3.
Office Action dated May 26, 2015 in Japanese Patent Application No. 2014-148506.
Office Action dated Mar. 29, 2016 in Japanese Application No. 2015-145789 (without English translation).
Office Action issued in corresponding Japanese Patent Application No. 2014-148506 dated Jan. 26, 2016.
Extended European Search Report dated Dec. 16, 2016 in Patent Application No. 16189429.0.
U.S. Office Action issued in U.S. Appl. No. 15/238,526 dated Nov. 1, 2018.
Office Action dated Feb. 27, 2019, in co-pending U.S. Appl. No. 15/238,526.
Additional References sheet(s) attached.

\* cited by examiner

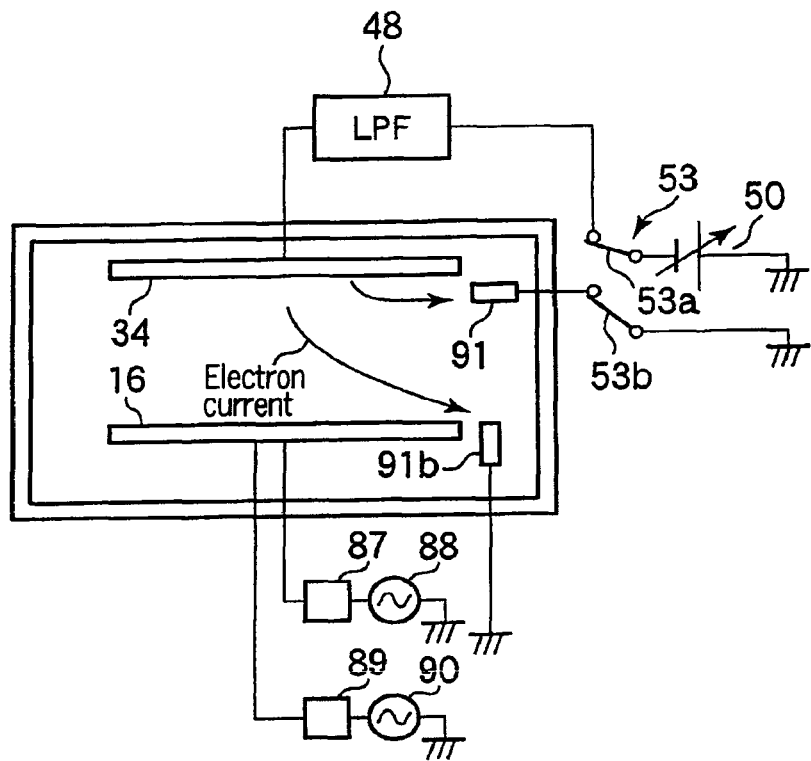
F I G. 17A
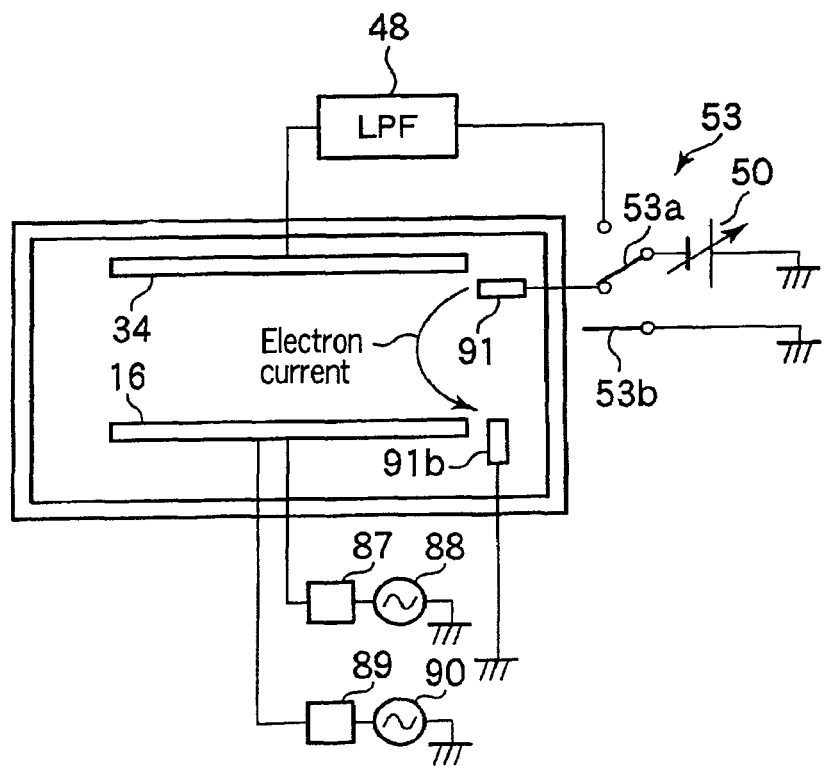
F I G. 17B

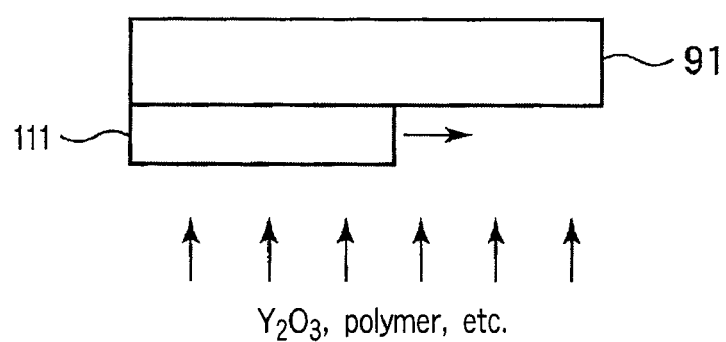
F I G. 21

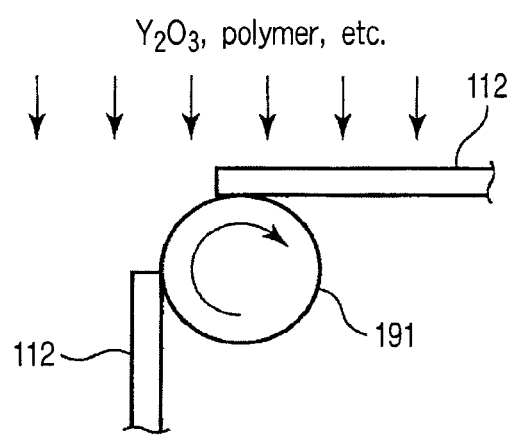
F I G. 22

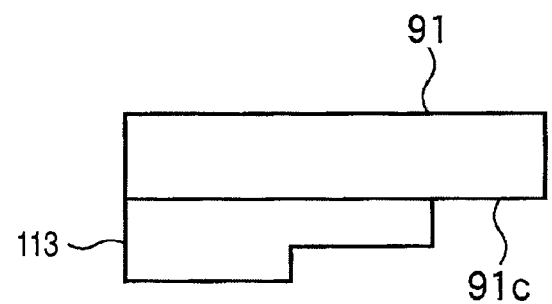
F I G. 23A
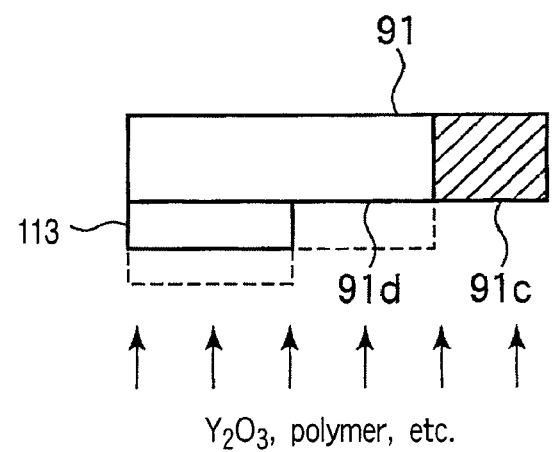
Y$_2$O$_3$, polymer, etc.
F I G. 23B

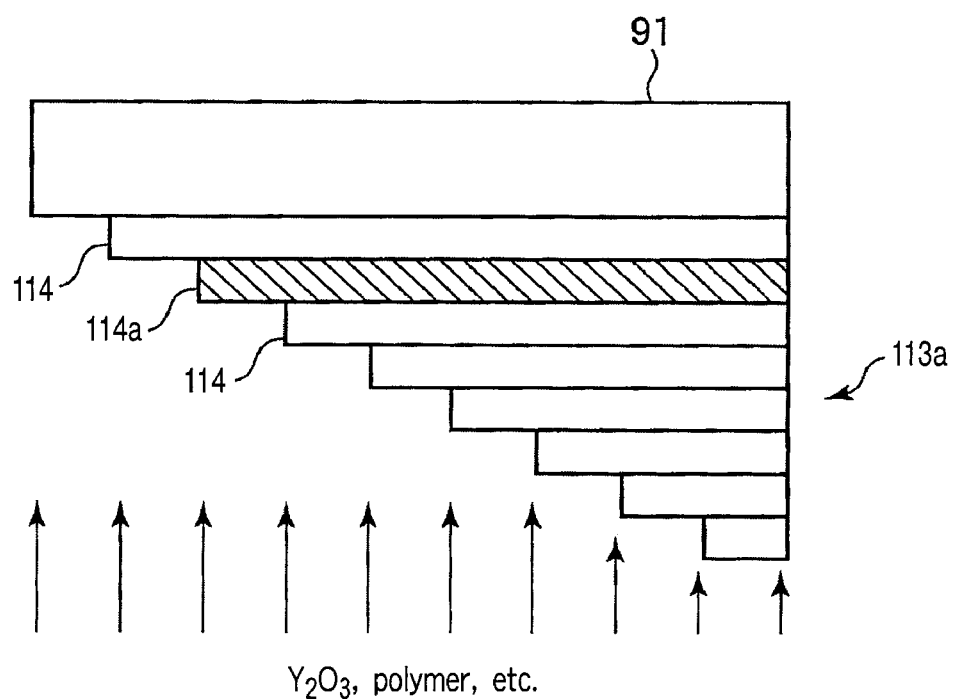
F I G. 24

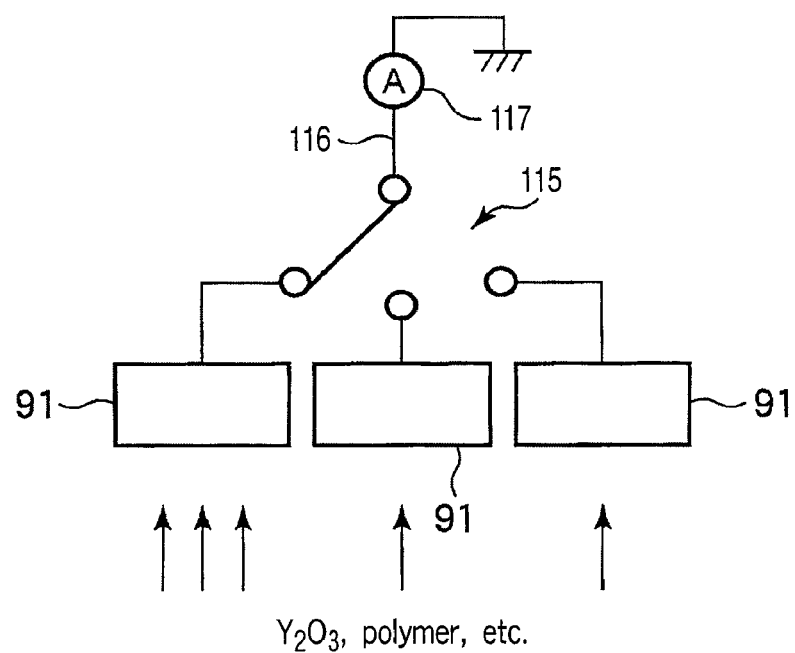
F I G. 25

PLASMA PROCESSING APPARATUS AND METHOD

CROSS-REFERENCE TO RELATED APPLICATIONS

This application is a continuation application of U.S. application Ser. No. 13/113,330, filed May 23, 2011, (the entire contents of which are incorporated herein by reference) which is a divisional of U.S. application Ser. No. 11/156,561, filed Jun. 21, 2005 (now U.S. Pat. No. 7,951,262), which claims the benefit of U.S. Provisional Applications No. 60/589,831, filed Jul. 22, 2004; No. 60/650,957, filed Feb. 9, 2005; and No. 60/662,344, filed Mar. 17, 2005.

This application is based upon and claims the benefit of priority from the prior Japanese Patent Applications No. 2004-183093, filed Jun. 21, 2004; No. 2005-013912, filed Jan. 21, 2005; and No. 2005-045095, filed Feb. 22, 2005, the entire contents of all of which are incorporated herein by reference.

BACKGROUND OF THE INVENTION

Field of the Invention

The present invention relate to a plasma processing apparatus, plasma processing method, and computer readable storage medium, used for performing a plasma process on a target substrate, such as a semiconductor substrate.

Description of the Related Art

For example, in manufacturing semiconductor devices, plasma etching processes, which utilize plasma to etch a layer through a resist mask, are often used for forming a predetermined pattern on a predetermined layer disposed on a target substrate or semiconductor wafer.

There are various plasma etching apparatuses for performing such plasma etching, but parallel-plate plasma processing apparatuses of the capacitive coupling type are the ones in main stream use.

In general, a parallel-plate plasma etching apparatus of the capacitive coupling type includes a chamber with parallel-plate electrodes (upper and lower electrodes) disposed therein. While a process gas is supplied into the chamber, an RF (radio frequency) is applied to one of the electrodes to form an electric field between the electrodes. The process gas is turned into plasma by the RF electric field, thereby performing plasma etching on a predetermined layer disposed on a semiconductor wafer.

More specifically, there is known a plasma etching apparatus in which an RF for plasma generation is applied to the upper electrode to generate plasma, while an RF for on attraction is applied to the lower electrode (for example, Jpn. Pat. Appln. KOKAI Publication No. 2000-173993 (Patent publication 1)). This plasma etching apparatus can form a suitable plasma state and realize an etching process with high selectivity and high reproducibility.

In recent years, owing to the demands of increased micro-fabrication, the thickness of photo-resist films used as masks is reduced, while the type of photo-resist is shifted from KrF photo-resist (i.e., a photo-resist to be exposed with a laser beam emitted from KrF gas) to ArF photo-resist (i.e., a photo-resist to be exposed with a shorter-wavelength laser beam emitted from ArF gas), which allows formation of pattern opening portions of about 0.13 µm or less.

However, since the ArF photo-resist has poor plasma resistance properties, its surface becomes rough during etching, which is scarcely caused in the KrF resist. Accordingly, problems arise in that vertical lines (striation) are formed on the inner wall of opening portions, or opening portions are expanded (increase in CD). These problems prevent, along with a small thickness of the photo-resist, etching holes from being formed with good etching selectivity.

On the other hand, in etching apparatuses of this kind, if the power level of an RF power for plasma generation applied to the upper electrode is too low, deposited substances (deposition) may remain on the upper electrode after etching, thereby varying process characteristics or producing particles. By contrast, if the power level is too high, the electrode may be etched, thereby bringing about process characteristics different from those obtained by a lower power level. The suitable range of power from the RF power supply depends on the process, and the process should not be fluctuated by the power. Further, in serial etching processes, deposition sticking to the chamber wall causes a memory effect in that a previous process leaves some effect that affects a subsequent process. Accordingly, it is preferable to reduce deposition on the chamber wall.

Furthermore, in parallel-plate etching apparatuses of the capacitive coupling type, where the pressure in the chamber is high and the etching gas in use is a negative gas (for example, $CxFy$ or $O_2$), the plasma density becomes low at the chamber central portion, which makes it difficult to control the plasma density.

BRIEF SUMMARY OF THE INVENTION

The present invention has been made in consideration of the problems described above, and has an object to provide a plasma processing apparatus and plasma processing method, which can realize high selectivity etching while maintaining the plasma resistance properties of a resist layer or organic mask layer at a high level, or can effectively prevent deposition on an electrode, or can realize high rate etching, or can realize uniform etching on a target substrate.

According to a first aspect of the present invention, there is provided a plasma processing apparatus comprising: a process chamber configured to accommodate a target substrate and to be vacuum-exhausted; a first electrode and a second electrode disposed opposite each other within the process chamber, the second electrode being configured to support the target substrate; a first RF power application unit configured to apply a first RF power having a relatively higher frequency to the second electrode, a second RF power application unit configured to apply a second RE power having a relatively lower frequency to the second electrode; a DC power supply configured to apply a DC voltage to the first electrode; and a process gas supply unit configured to supply a process gas into the process chamber.

In this apparatus, it may be adopted that the DC power supply is configured such that any one of application voltage, application current, and application power to the first electrode is variable. The apparatus may further comprise a control unit configured to control any one of application voltage, application current, and application power from the DC power supply to the first electrode. In this case, it may be adopted that the control unit is configured to control whether the DC voltage is to be applied or not, from the DC power supply to the first electrode. The apparatus may further comprise a detector configured to detect a generated plasma state, wherein the control unit controls any one of application voltage, application current, and application power from the DC power supply to the first electrode, based on information from the detector.

In the plasma processing apparatus according to the first aspect of the present invention, typically, the first electrode is an upper electrode, and the second electrode is a lower electrode. In this case, the first RF power applied to the second electrode preferably has a frequency of 27 MHz or more, and more preferably has a frequency of 40 MHz or more. It is preferable that the second RF power applied to the second electrode has a frequency of 13.56 MHz or less.

In the plasma processing apparatus according to the first aspect of the present invention, it is preferable that the DC power supply is configured to apply a voltage within a range of −2,000 to +1,000V. It may be adopted that a surface of the first electrode facing the second electrode is made of a silicon-containing substance.

In the plasma processing apparatus according to the first aspect of the present invention, it is preferable that the first electrode is in a floating state relative to a ground potential in a sense of DC. In this case, it is preferable that the apparatus further comprises a change over device configured to change over the first electrode between the floating state and a grounded state, wherein, based or a command from an overall control unit, the changeover device sets the first electrode in the floating state relative to a ground potential when the DC voltage is applied to the first electrode, and the changeover device sets the first electrode in the floating state or the grounded state relative to the ground potential when the DC voltage is not applied to the first electrode.

In the plasma processing apparatus according to the first aspect of the present invention, it maybe adopted that a conductive member regularly grounded is disposed within the process chamber to release through plasma a current caused by the DC voltage applied from the DC power supply to the first electrode. In this case, it maybe adopted that the first electrode is an upper electrode, the second electrode is a lower electrode, and the conductive member is disposed around the second electrode, or the conductive member is disposed near the first electrode. It may be adopted that the conductive member is disposed to form a ring shape around the first electrode. It may be adopted that the grounded conductive member has a recess to prevent flying substances from being deposited during a plasma process.

In the structure described above, it may be adopted that a cover plate is disposed to partly cover the conductive member and the cover plate is moved relative to the conductive member by a driving mechanism to change a portion of the conductive member to be exposed to plasma. It may be adopted that the conductive member is columnar and partly exposed to plasma, and the conductive member is rotated about a center thereof by a driving mechanism to change a portion of the conductive member to be exposed to plasma. It may be adopted that a cover film having a stepped shape and made of a material to be etched by plasma is disposed to partly cover the conductive member, and the cover film is configured to be etched to change a portion of the conductive member to be exposed to plasma.

In the plasma processing apparatus according to the first aspect of the present invention, it maybe adopted that a conductive member to be grounded based on a command from an overall control unit is disposed within the process chamber to release through plasma a current caused by the DC voltage applied from the DC power supply to the first electrode. In this case, it may be adopted that the first electrode is an upper electrode, the second electrode is a lower electrode, and the conductive member is disposed around the second electrode, or the conductive member is disposed near the first electrode. It may be adopted that the conductive member is disposed to form a ring shape around the first electrode. It may be adopted that the grounded conductive member has a recess to prevent flying substances from being deposited during a plasma process. It may be adopted that the conductive member is grounded during plasma etching.

It may be adopted that the conductive member is configured to be supplied with a DC voltage or AC voltage, and the DC voltage or AC voltage is applied based on a command from an overall control unit to sputter or etch a surface of the conductive member. In this case, it is preferable that the DC voltage or AC voltage is applied to the conductive member during cleaning. The apparatus may further comprise a switching mechanism configured to switch connection of the conductive member between the DC power supply and a ground line, wherein, when the conductive member is connected to the DC power supply by the switching mechanism, the DC voltage or AC voltage is applied from the DC power supply to the conductive member to sputter or etch a surface thereof. In this structure, it is preferable that the conductive member is configured to be supplied with a negative DC voltage. Where a negative DC voltage is applicable, it is preferable that a grounded conductive auxiliary member is disposed within the process chamber to release a DC electron current flowing into the process chamber when the negative DC voltage is applied to the conductive member. In this case, it may be adopted that the first electrode is an upper electrode, the second electrode is a lower electrode, the conductive member is disposed near the first electrode, and the conductive auxiliary member is disposed around the second electrode.

In the plasma processing apparatus according to the first aspect of the present invention, the apparatus may further comprise a conductive member disposed within the process chamber and configured to take on either one of a first state and a second state based on a command from an overall control unit, the first state being arranged to ground the conductive member to release through plasma a DC current applied from the DC power supply to the first electrode, and the second state being arranged to apply a DC voltage from the DC power supply to the conductive member to sputter or etch a surface thereof and a connection switching mechanism disposed to switch between first connection and second connection to form the first state and the second state, respectively, the first connection being arranged to connect a negative terminal of the DC power supply to the first electrode and to connect the conductive member to a ground line, and the second connection being arranged to connect a positive terminal of the DC power supply to the first electrode and to connect the negative terminal of the DC power supply to the conductive member. In this case, it is preferable that the first state is formed during plasma etching, and the second state is formed during cleaning of the conductive member.

According to a second aspect of the present invention, there is provided plasma processing method using a process chamber with a first electrode and a second electrode disposed opposite each other therein, the second electrode being configured to support a target substrate, the method comprising supplying a process gas into the process chamber, while applying a first RF power having a relatively higher frequency and a second RF power having a relatively lower frequency to the second electrode, to generate plasma of the process gas, thereby performing a plasma process on a target substrate supported by the second electrode, wherein the method comprises: applying a DC voltage to the first electrode; and performing the plasma process on the target substrate while the applying the DC voltage to the first electrode.

In this method, it may be adopted that any one of application voltage, application current, and application power applied to the first electrode is variable. The method may further comprise controlling any one of application voltage, application current, and application power applied to the first electrode. The method may further comprise controlling whether the DC voltage is to be applied or not to the first electrode. The method may further comprise detecting a generated plasma state, to control any one of application voltage, application current, and application power to the first electrode, based on detected information.

In the plasma processing method according to the second aspect of the present invention, it is preferable that the first electrode is in a floating state relative to a ground potential in a sense of DC. In this case, it is preferable that the first electrode is changeable between the floating state and a grounded state, and wherein, based on a command from an overall control unit, the first electrode is set in the floating state relative to a ground potential when the DC voltage is applied to the first electrode, and the first electrode is set in the floating state or the grounded state relative to the ground potential when the DC voltage is not applied to the first electrode.

In the plasma processing method according to the second aspect of the present invention, it is preferable that a conductive member regularly grounded is disposed within the process chamber to release through plasma a current caused by the DC voltage applied to the first electrode. Alternatively it is preferable that a conductive member to be grounded based on a command from an overall control unit is disposed within the process chamber to release through plasma a current caused by the DC voltage applied to the first electrode.

In the arrangements described above, it may be adopted that the conductive member is grounded during plasma etching. It may be adopted that the conductive member is configured to be supplied with a DC voltage or AC voltage, and the DC voltage or AC voltage is applied based on a command from an overall control unit to sputter or etch a surface of the conductive member. It may be adopted that the DC voltage or AC voltage is applied to the conductive member during cleaning. It may be adopted that a switching mechanism is further disposed to switch connection of the conductive member between a DC power supply configured to apply a DC voltage and a ground line, and wherein, when the conductive member is connected to the DC power supply by the switching mechanism, the DC voltage or AC voltage is applied from the DC power supply to the conductive member to sputter or etch a surface thereof. It maybe adopted that the conductive member is configured to be supplied with a negative DC voltage. It maybe adopted that a grounded conductive auxiliary member is disposed within the process chamber to release a DC electron current flowing into the process chamber when the negative DC voltage is applied to the conductive member.

In the plasma processing method according to the second aspect of the present invention, it maybe adopted that the method comprises etching an insulating film on the target substrate supported by the second electrode, wherein the process gas comprises any one of a combination of $C_5F_8$, Ar, and $N_2$, a combination of $C_4F_8$, Ar, and $N_2$, a combination of $C_4F_8$, Ar, $N_2$, and $O_2$, and a combination of $C_4F_8$, Ar, $N_2$, and CO to increase selectivity of the insulating film relative to an underlying film. It may be adopted that the method comprises etching an insulating film on the target substrate supported by the second electrode, wherein the process gas comprises $CF_4$ or a combination of $CF_4$, Ar or $N_2$, and H2 to increase selectivity of the insulating film relative to a mask. It may be adopted that the method comprises etching an organic anti-reflection film on an insulating film on the target substrate supported by the second electrode, wherein the process gas comprises anyone of $CF_4$, a combination of $CF_4$ and $C_3F_8$, a combination of $CF_4$ and $C_4F_8$, and a combination of $CF_4$ and $C_4F_6$. It may be adopted that the method comprises etching an insulating film on the target substrate supported by the second electrode, wherein the process gas comprises anyone of a combination of $C_4F_6$, $CF_4$, Ar, and $O_2$, a combination of $C_4F_6$, $C_3F_8$, Ar, and $O_2$, a combination of $C_4F_6$, $C_4F_8$, Ar, and $O_2$, a combination of $C_4F_6$, C2F6, Ar, and $O_2$, a combination of $C_4F_8$, Ar, and $O_2$, and a combination of $C_4F_8$, Ar, and $O_2$ to increase an etching rate of the insulating film.

According to a third aspect of the present invention, there is provided a computer storage medium storing a control program for execution on a computer, wherein the control program, when executed, controls a plasma processing apparatus to perform the plasma processing method according to the second aspect.

According to the present invention, the first RF power application unit configured to apply a first RF power having a relatively higher frequency, and the second RF power application unit configured to apply a second RF power having a relatively lower frequency is connected to the second electrode for supporting a target substrate, and the DC power supply configured to apply a DC voltage is connected to the first electrode. With this arrangement, when the RF powers having different frequencies are applied from first and second RF power application unit to the second electrode to generate plasma of a process gas and attract ions onto the target substrate so as to perform a plasma process, the DC voltage is further applied to the first electrode. As a consequence, it is possible to exercise at least one of (1) the effect of increasing the absolute value of a self-bias voltage to the first electrode to sputter the first electrode surface, (2) the effect of expanding the plasma sheath on the first electrode side to press the plasma, (3) the effect of irradiating the target substrate with electrons generated near the first electrode, (4) the effect of controlling the plasma potential, (5) the effect of increasing the electron (plasma) density, and (6) the effect of increasing the plasma density at the central portion.

With the effect (1) described above, even if polymers derived from a process gas and a photo-resistance deposited on the surface of the first electrode, the polymers are sputtered, thereby cleaning up the surface of the first electrode. Further, an optimum quantity of polymers can be supplied onto the substrate, thereby canceling the surface roughness of the photo-resist film. Further, since the body of the electrode is sputtered, the electrode material can be supplied onto the substrate, thereby reinforcing an organic mask made of, e.g., a photo-resist film.

With the effect (2) described above, the effective residence time above the target substrate is decreased, and the plasma concentrates above the target substrate with less diffusion, thereby reducing the dissociation space. In this case, dissociation of a fluorocarbon family process gas is suppressed for an organic mask made of, e.g., a photo-resist film to be less etched.

With the effect (3) described above, the composition of a mask on the target substrate is reformed and the roughness of the photo-resist film is cancelled. Further, since the target substrate is irradiated with electrons at a high velocity, the shading effect is suppressed and micro-fabrication is thereby improved on the target substrate.

With the effect (4) described above, the plasma potential can be suitably controlled to prevent etching by-products from being deposited on members inside the process chamber, such as the electrodes, chamber wall (e.g., deposition shield) and insulating members.

With the effect (5) described above, the etching rate (etching speed) on the target substrate is improved.

With the effect (6) described above, even where the pressure inside the process chamber is high and the etching gas employed is a negative gas, the plasma density is prevented from being lower at the central portion than at the peripheral portion within the process chamber (suppressing generation of negative ions), so as to control the plasma density to be more uniform.

As a consequence, the plasma resistance property of an organic mask layer made of, e.g., a resist layer remains high, so that the etching can be performed with high selectivity. Alternatively, the electrodes can be effectively free from deposited substances. Alternatively, the etching can be performed on the target substrate at a high rate or uniformly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 17A and 17B are schematic views showing a state in plasma etching and a state in cleaning, respectively, of the device shown in FIG. 16;

FIG. 21 is a schematic view showing an example of the GND block having a function to prevent it from losing the grounding performance in the sense of DC;

FIG. 22 is a schematic view showing another example of the GND block having a function to prevent it from losing the grounding performance in the sense of DC;

FIGS. 23A and 23B are schematic views each showing another example of the GND block having a function to prevent it from losing the grounding performance in the sense of DC;

FIG. 24 is a schematic view showing another example of the GND block having a function to prevent it from losing the grounding performance in the sense of DC;

FIG. 25 is a schematic view showing another example of the GND block having a function to prevent it from losing the grounding performance in the sense of DC.

DETAILED DESCRIPTION OF THE INVENTION

Embodiments of the present invention will be described hereinafter with reference to the accompanying drawings.

Figure 1:
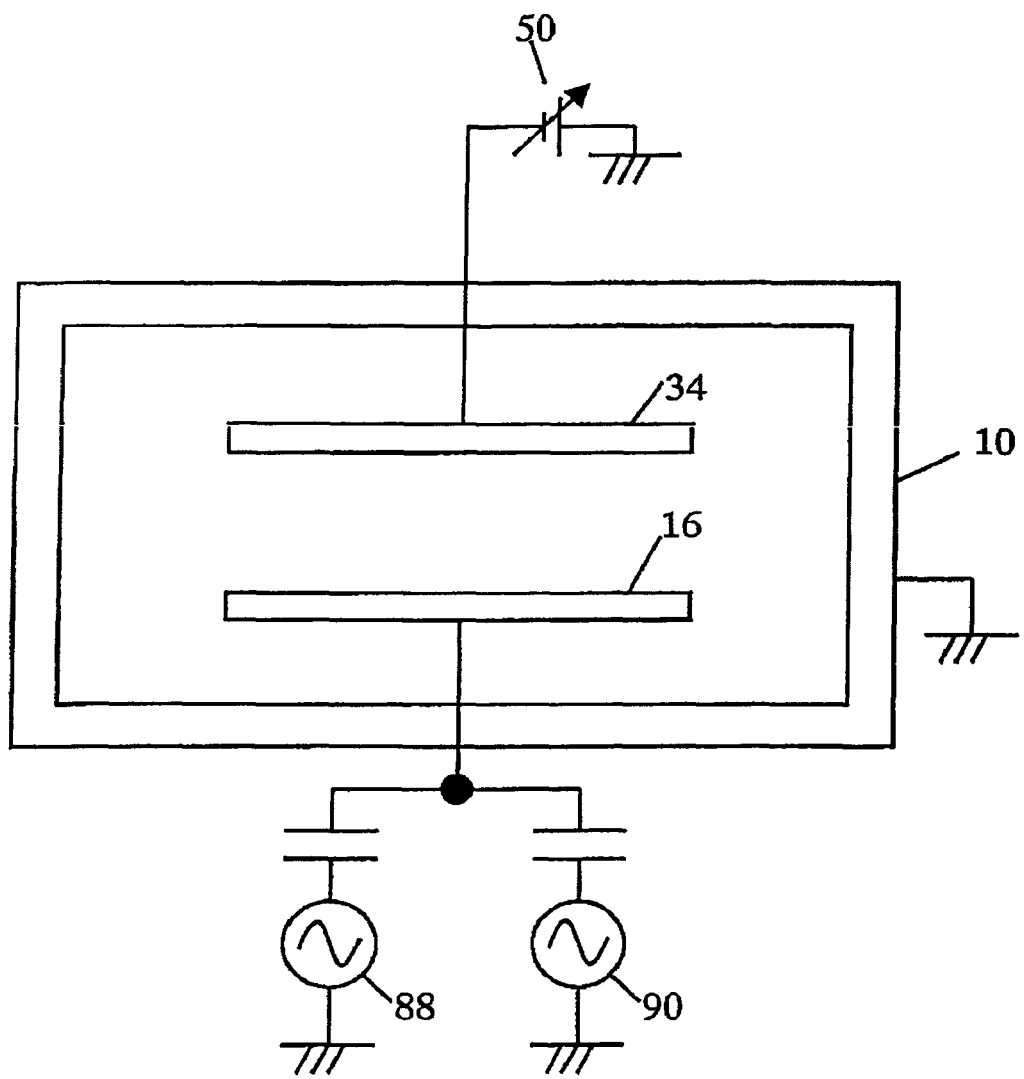
FIG. 1 is a sectional view schematically showing a plasma etching apparatus according to an embodiment of the present invention.

FIG. 1 is a sectional view schematically showing a plasma etching apparatus according to an embodiment of the present invention.

Figure 2:
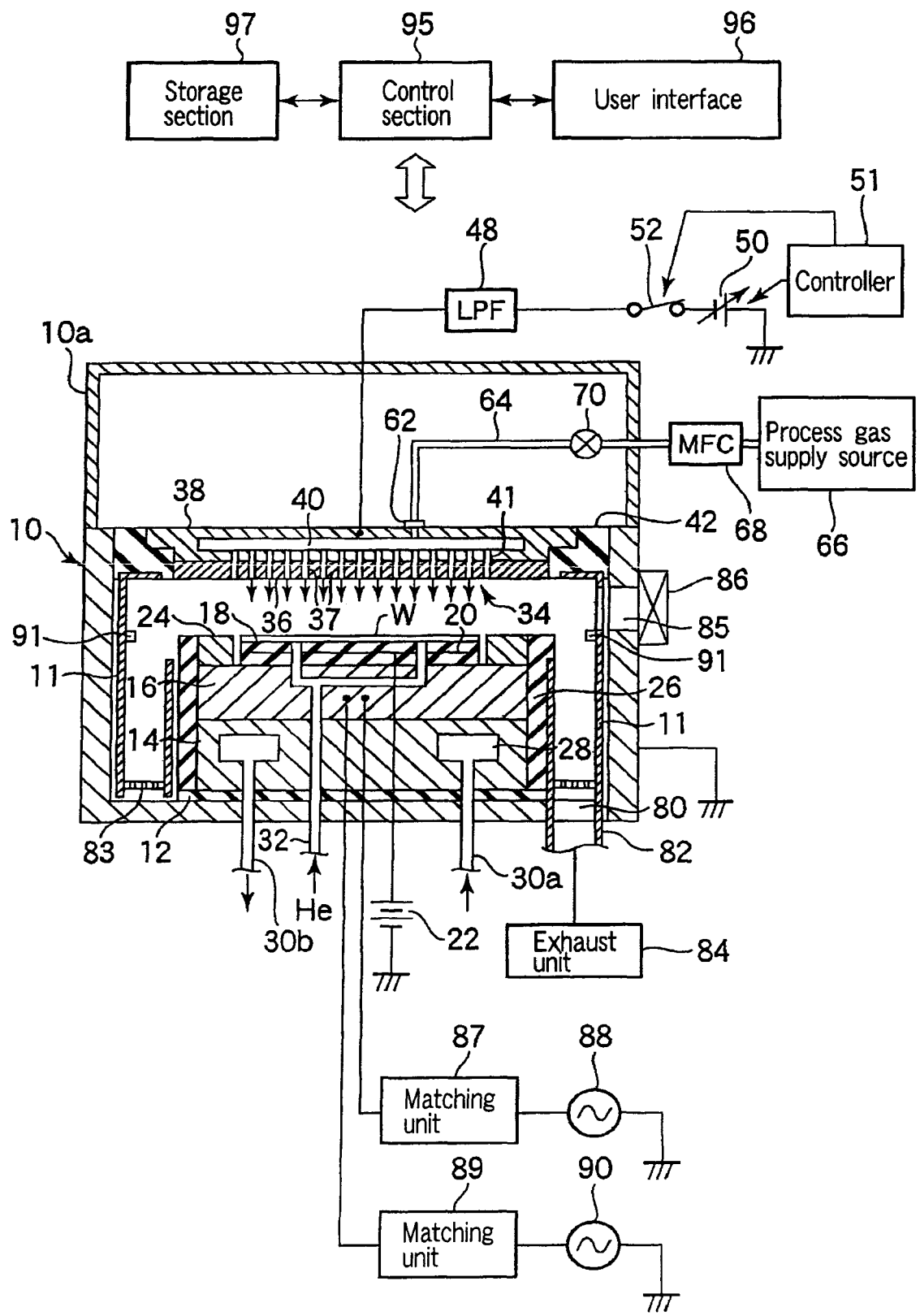
FIG. 2 is a sectional view schematically showing a plasma etching apparatus according to the embodiment of the present invention.

This plasma etching apparatus is of the type that applies two RF powers with different frequencies to the lower side. Specifically, a radio frequency (RF) power with, e.g., 40 MHz for plasma generation from a first RF power supply 88 and a radio frequency (RF) with, e.g., 2 MHz for ion attraction from a second RF power supply 90 are applied to a lower electrode or susceptor 16. Further, as shown in FIG. 1, a variable DC power supply 50 is connected to an upper electrode 34 to apply a predetermined direct current (DC) voltage. With reference to FIG. 2, this plasma etching apparatus will be explained in more detail.

This plasma etching apparatus is structured as a parallel-plate plasma etching apparatus of the capacitive coupling type. The apparatus includes a cylindrical chamber (process chamber) 10, which is made of, e.g., aluminum with an anodization-processed surface. The chamber 10 is protectively grounded.

A columnar susceptor pedestal 14 is disposed on the bottom of the chamber 10 through an insulating plate 12 made of, e.g., a ceramic. A susceptor 16 made of, e.g., aluminum is disposed on the susceptor pedestal 14. The susceptor 16 is used as a lower electrode, on which a target substrate, such as a semiconductor wafer W, is placed.

The susceptor 16 is provided with an electrostatic chuck 18 on the top, for holding the semiconductor wafer W by an electrostatic attraction force. The electrostatic chuck 18 comprises an electrode 20 made of a conductive film, and a pair of insulating layers or insulating sheets sandwiching the electrode 20. The electrode 20 is electrically connected to a direct current (DC) power supply 22. The semiconductor wafer W is attracted and held on the electrostatic chuck 18 by an electrostatic attraction force, e.g., a Coulomb force, generated by a DC voltage applied from the DC power supply 22.

A conductive focus ring (correction ring) 24 made of, e.g., silicon is disposed on the top of the susceptor 16 to surround the electrostatic chuck 18 (and the semiconductor wafer W) to improve etching uniformity. A cylindrical inner wall member 26 made of, e.g., quartz is attached to the side of the susceptor 16 and susceptor pedestal 14.

The susceptor pedestal 14 is provided with a cooling medium space 28 formed therein and annularly extending there through. A cooling medium set at a predetermined temperature, such as cooling water is circulated within the cooling medium space 28 from a chiller unit (not shown) through lines 30a and 30b. The temperature of the cooling medium is set to control the process temperature of the semiconductor wafer W placed on the susceptor 16.

Further, a heat transmission gas, such as He gas, is supplied from a heat transmission gas supply unit (not shown), through a gas supply line 32, into the interstice between the top surface of the electrostatic chuck 18 and the bottom surface of the semiconductor wafer W.

An upper electrode 34 is disposed above the lower electrode or susceptor 16 in parallel with the susceptor. The space between the electrodes 16 and 34 is used as a plasma generation space. The upper electrode 34 defines a surface facing the semiconductor wafer W placed on the lower electrode or susceptor 16, and thus this facing surface is in contact with the plasma generation space.

The upper electrode 34 is supported at the top of the chamber 10 by an insulating shield member 42. The upper electrode 34 includes an electrode plate 36 defining the facing surface opposite the susceptor 16 and having a number of gas delivery holes 37, and an electrode support 38 detachably supporting the electrode plate 36. The electrode support 38 is made of a conductive material, such as aluminum with an anodization-processed surface, and has a water-cooling structure. The electrode plate 36 is preferably made of a conductor or semiconductor having a low resistivity and thus generating less Joule heat. Further, in order to reinforce a resist film, as described later, the electrode plate 36 is preferably made of a silicon-containing substance. In light of these factors, the electrode plate 36 is preferably made of silicon or SiC. The electrode support 38 has a gas diffusion cell 40 formed therein, which is connected to the gas delivery holes 37 through a number of gas flow channels 41 extending downward.

Further, the electrode support 38 has a gas feed port 62 formed therein for feeding a process gas into the gas diffusion cell 40. The gas feed port 62 is connected to a process gas supply source 66 through a gas supply line 64. The gas supply line 64 is provided with a mass-flow controller (MFC) 68 and a switching valve 70 disposed thereon in this order from the upstream. A process gas for etching, such as a fluorocarbon gas (CxFy), e.g., $C_4F_8$ gas, is supplied from the process gas supply source 66 through the gas supply line 64 into the gas diffusion cell 40. Then, the process gas flows through the gas flow channels 41 and is delivered from the gas delivery holes 37 into the plasma generation space, as in a shower device. Accordingly, in other words, the upper electrode 34 functions as a shower head for supplying a process gas.

The upper electrode 34 is electrically connected to a variable DC power supply 50 through a low-pass filter (LPF) 48. The variable DC power supply 50 may be formed of a bipolar power supply. The electric feeding one variable DC power supply 50 is set on/off by an on/off switch 52. The polarity, current, and voltage of the variable DC power supply 50, and the on/off switch 52 are controlled by a controller (control unit) 51.

The low-pass filter (LPF) 48 is configured to trap the RF from first and second RF power supplies, as described later, and is preferably formed of an LR filter or LC filter.

The sidewall of the chamber 10 extends upward above the height level of the upper electrode 34 and forms a cylindrical grounded conductive body 10a. The cylindrical grounded conductive body 10a includes a top or ceiling wall.

The lower electrode or susceptor 16 is electrically connected to a first RF power supply 88 through a matching unit 87, and to a second RF power supply 90 through a matching unit 89. The first RF power supply 88 outputs an RF power with a frequency of 27 MHz or more, such as 40 MHz. The second RF power supply 90 outputs an RF power with a frequency of 13.56 MHz or less, such as 2 MHz.

The matching units 87 and 89 are arranged to match the load impedance with the internal (or output) impedance of the first and second RF power supplies 88 and 90, respectively. When plasma is generated within the chamber 10, the matching units 87 and 89 perform control for the load impedance and the internal impedance of the first and second RF power supplies 88 and 90 to apparently agree with each other.

An exhaust port 80 is formed at the bottom of the chamber 10, and is connected to an exhaust unit 84 through an exhaust line 82. The exhaust unit 84 includes a vacuum pump, such as a turbo molecular pump, to reduce the pressure inside the chamber 10 to a predetermined vacuum level. A transfer port 85 for a semiconductor wafer W is formed in the sidewall of the chamber 10, and is opened/closed by a gate valve 86 attached thereon. A deposition shield 11 is detachably disposed along the inner wall of the chamber 10 to prevent etching by-products (deposition) from being deposited on the wall. In other words, the deposition shield 11 constitutes a chamber wall. A deposition shield 11 is also disposed around the inner wall member 26. An exhaust plate 83 is disposed at the bottom of the chamber 10 between the deposition shield 11 on the chamber wall and the deposition shield 11 on the inner wall member 26. The deposition shield 11 and exhaust plate 83 are preferably made of an aluminum body covered with a ceramic, such as $Y_2O_3$.

A conductive member (GND block) 91 is disposed on a portion of the deposition shield 11 that constitutes the chamber inner wall, at a height essentially the same as the wafer W, and is connected to ground in the sense of DC. This arrangement provides the effect of preventing abnormal electric discharge, as described later.

Respective portions of the plasma etching apparatus are connected to and controlled by a control section (overall control unit) 95. The control section 95 is connected to a user interface 96 including, e.g., a keyboard and a display, wherein the keyboard is used for a process operator to input commands for operating the plasma etching apparatus, and the display is used for showing visualized images of the operational status of the plasma processing apparatus.

Further, the control section 95 is connected to a storage section 97 that stores control programs for the control section 95 to control the plasma etching apparatus so as to perform various processes, and programs or recipes for respective components of the plasma etching apparatus to perform processes in accordance with process conditions. Recipes may be stored in a hard disk or semiconductor memory, or stored in a computer readable portable storage medium, such as a CDROM or DVD, to be attached to a predetermined position in the storage section 97.

A required recipe is retrieved from the storage section 97 and executed by the control section 95 in accordance with an instruction or the like through the user interface 96. As a consequence, the plasma etching apparatus can perform a predetermined process under the control of the control section 95. It should be noted that each of the plasma processing apparatuses (plasma etching apparatuses) according to embodiments of the present invention includes such a control section 95.

When an etching process is performed in the plasma etching apparatus described above, the gate valve 86 is first opened, and a semiconductor wafer W to be etched is transferred into the chamber 10 and placed on the susceptor 16. Then, a process gas for etching is supplied from the process gas supply source 66 into the gas diffusion cell 40 at a predetermined flow rate, and then supplied into the chamber 10 through the gas flow channels 41 and gas delivery holes 37. At the same time, the interior of the chamber 10 is exhausted by the exhaust unit 84 to set the pressure inside the chamber 10 to be a predetermined value within a range of, e.g., 0.1 to 150 Pa. The process gas may be selected from various gases conventionally employed, and preferably is a gas containing a halogen element, a representative of which is a fluorocarbon gas (CxFy), such as $C_4F_8$ gas. Further, the process gas may contain another gas, such as Ar gas or $O_2$ gas.

While the etching gas is supplied into the chamber 10, an RF power for plasma generation is applied from the first RF power supply 88 to the lower electrode or susceptor 16 at a predetermined power level. Also, an RF for ion attraction is applied from the second RF power supply 90 to the lower electrode or susceptor 16 at a predetermined power level. On the other hand, a predetermined DC voltage is applied from the variable DC power supply 50 to upper electrode 34. Further, a DC voltage is applied from the DC power supply 22 to the electrode 20 of the electrostatic chuck 18 to fix the semiconductor wafer W on the susceptor 16.

The process gas delivered from the gas delivery holes 37 formed in the electrode plate 36 of the upper electrode 34 is turned into plasma by glow discharge caused by the RF power applied across the upper electrode 34 and the lower electrode or susceptor 16. Radicals and ions generated in this plasma are used to etch the target surface of the semiconductor wafer W.

In this plasma etching apparatus, the lower electrode or susceptor 16 is supplied with an RF power within a range covering high frequencies (for example, 10 MHz or more) from the first RF power supply. As a consequence, the plasma density is increased with a preferable state, so that high density plasma is generated even under a low pressure condition.

In this embodiment, when the plasma is thus generated, a DC voltage with a predetermined polarity and value is applied from the variable DC power supply 50 to the upper electrode 34. At this time, the application electrode or upper electrode 34 is preferably set to have a self bias voltage $V_{dc}$ on the surface, at a level for obtaining a predetermined (moderate) sputtering effect onto the surface, i.e., the surface of the electrode plate 36. In other words, the application voltage from the variable DC power supply 50 is preferably controlled by the controller 51 to increase the absolute value of $V_{dc}$ on the surface of the upper electrode 34. Where an RF is applied from the first RF power supply 88 to generate plasma, polymers maybe deposited on the upper electrode 34. However, since a suitable DC voltage is applied from the variable DC power supply 50, polymers deposited on the upper electrode 34 are sputtered, thereby cleaning up the surface of the upper electrode 34. Further, an optimum quantity of polymers can be supplied onto the semiconductor wafer W, thereby canceling the surface roughness of the photo-resist film. Where the voltage applied from the variable DC power supply 50 is adjusted to sputter the body of the upper electrode 34, the electrode material can be supplied onto the surface of the semiconductor wafer W. In this case, the photo-resist film is provided with carbide formed on the surface, and is thereby reinforced. Further, the sputtered electrode material reacts with F contained in a fluorocarbon family process gas and is exhausted, thereby reducing the F ratio in plasma for the photo-resist film to be less etched. Particularly, where the electrode plate 36 is made of a silicon-containing material, such as silicon or SiC, sputtered silicon from the surface of the electrode plate 36 reacts with polymers, so the photo-resist film is provided with SiC formed on the surface, and is thereby remarkably reinforced. In addition to this, Si is highly reactive with F, and the effects described above are enhanced. Accordingly, a silicon-containing material is preferably used as a material of the electrode plate 36. It should be noted that, in this case, the application current or application power may be controlled in place of the application voltage from the variable DC power supply 50.

Figure 3A:
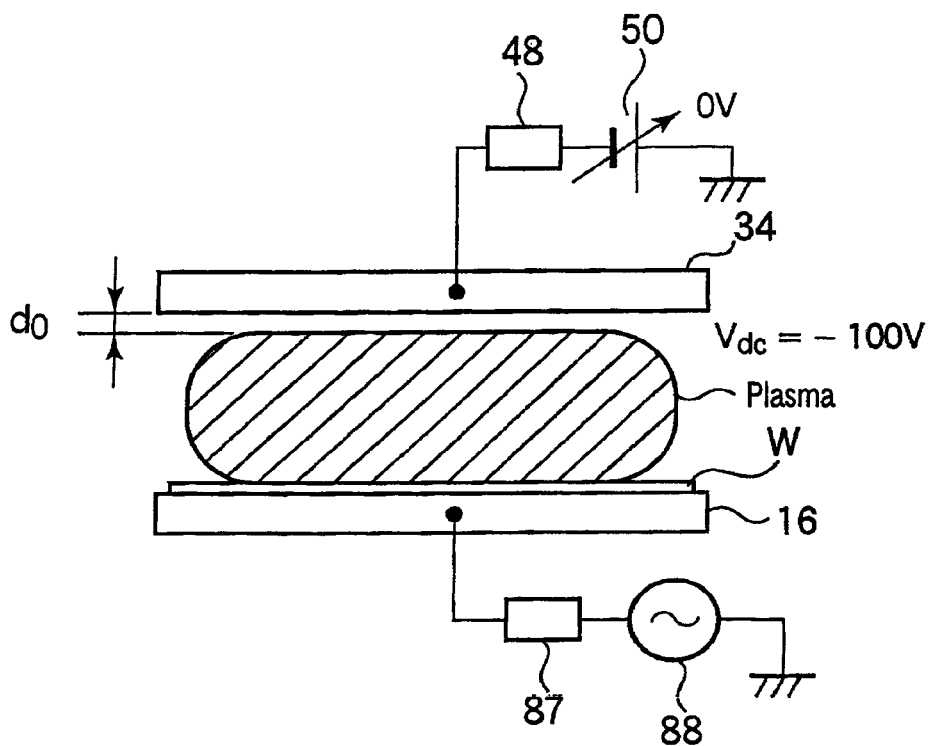
FIGS. 3A and 3B are views showing change in $V_{dc}$ and plasma sheath length where a DC voltage is applied to the upper electrode in the plasma etching apparatus shown in FIG. 2.
Figure 3B:
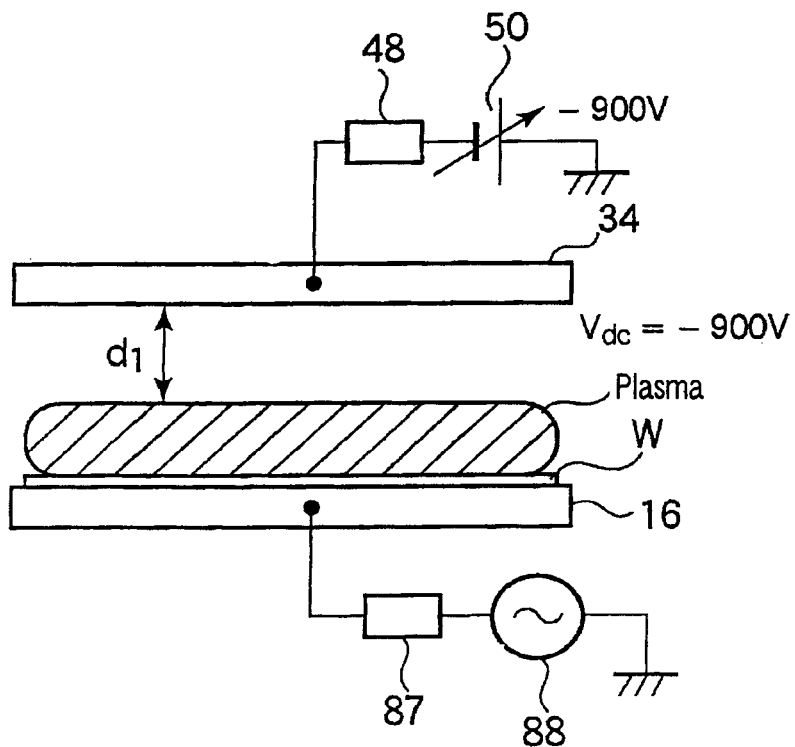
Figure 4A:
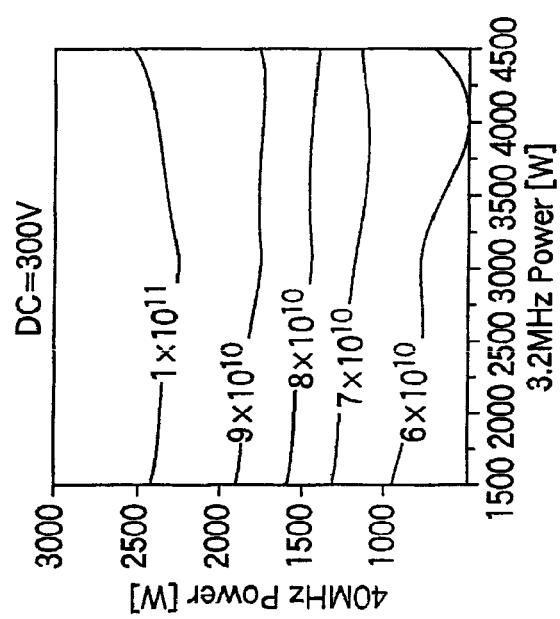
FIGS. 4A to 4D are views showing change in electron density where the DC voltage applied is set at different values under HARC etching conditions in the plasma etching apparatus shown in FIG. 2.
Figure 4B:
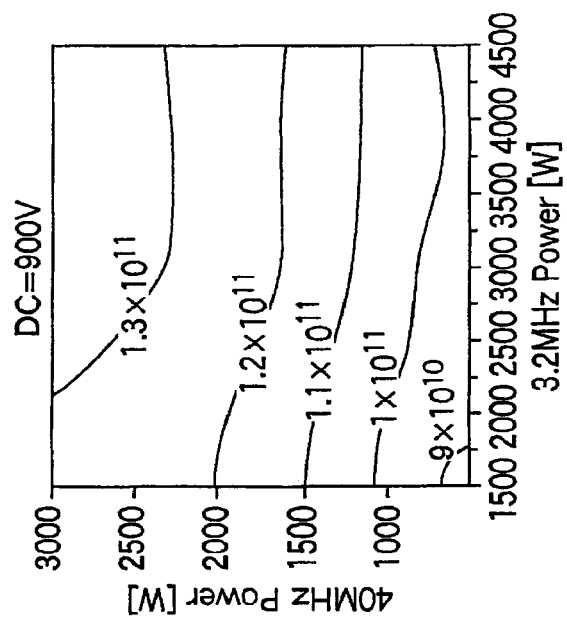
Figure 4C:
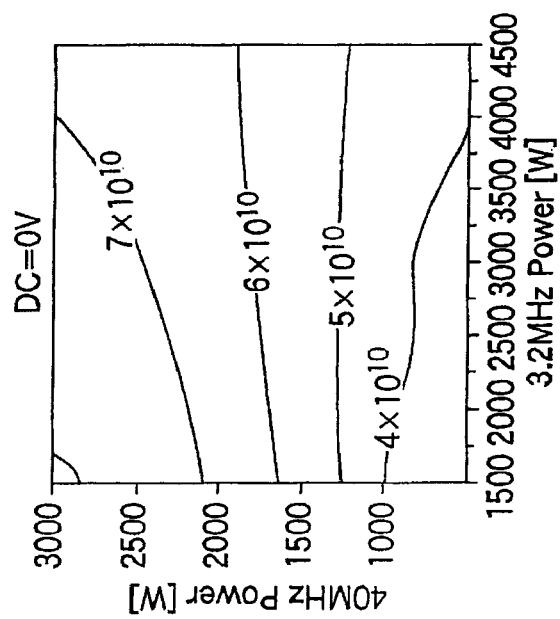
Figure 4D:
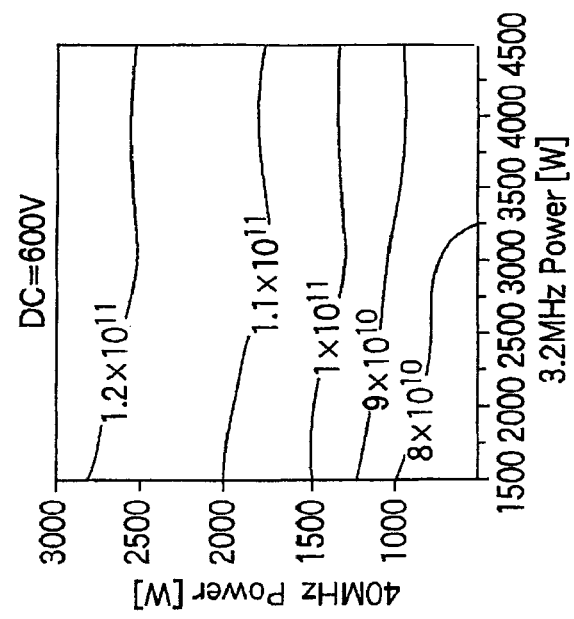
Figure 5A:
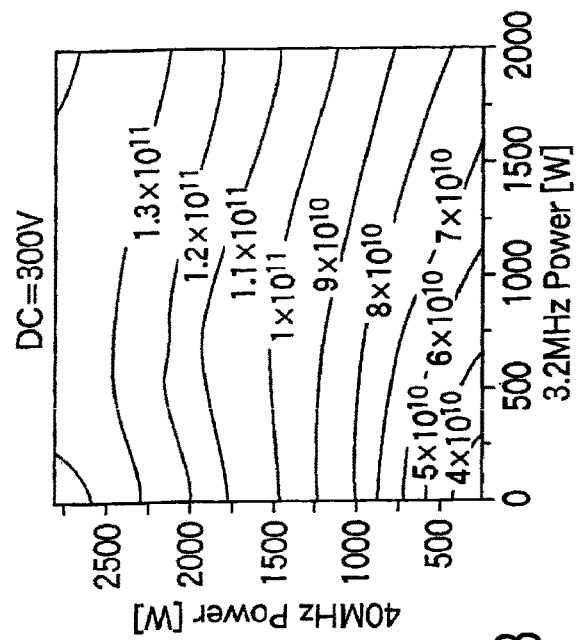
FIGS. 5A to 5D are views showing change in electron density where the DC voltage applied is set at different values under VIA etching conditions in the plasma etching apparatus shown in FIG. 2.
Figure 5B:
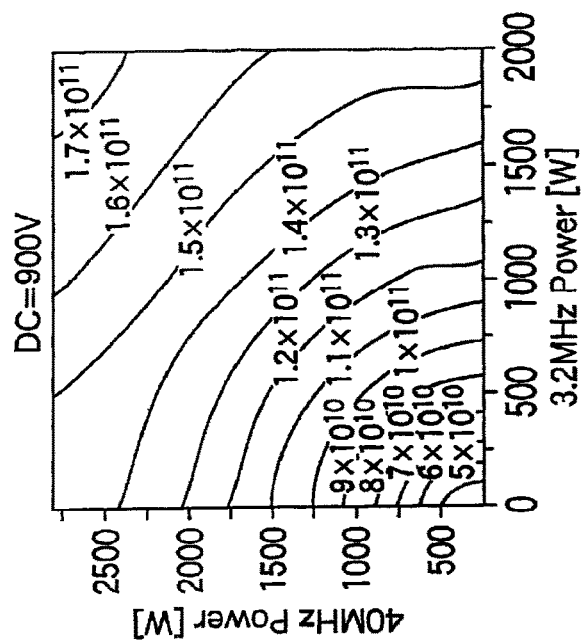
Figure 5C:
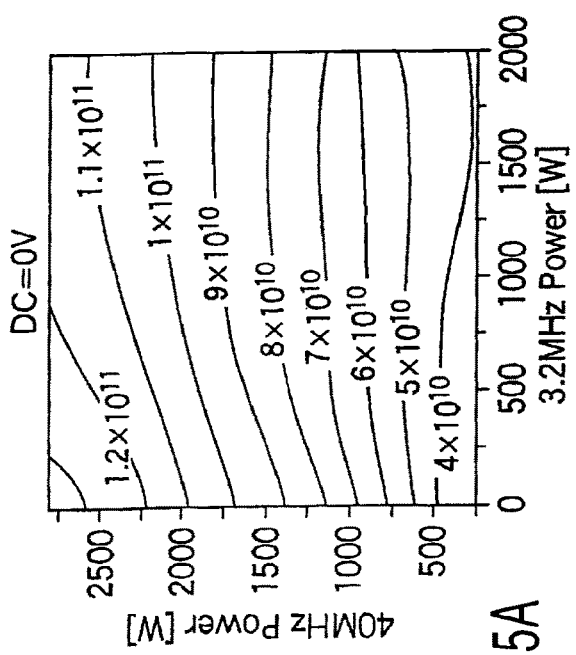
Figure 5D:
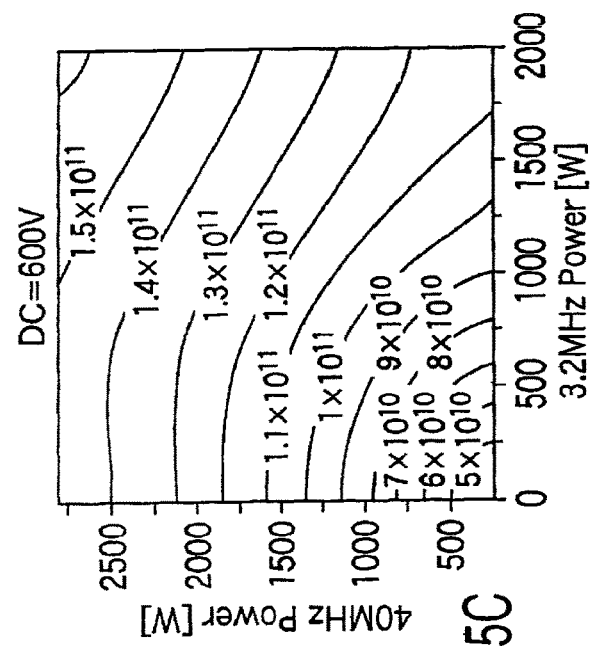

The DC voltage thus applied to the upper electrode 34 to make a deep self bias voltage $V_{dc}$, as described above, increases the length of a plasma sheath formed on the upper electrode 34, as shown in FIGS. 3A and 3B. As the length of the plasma sheath is increased, the plasma is further pressed by that much. For example, where no DC voltage is applied to the upper electrode 34, $V_{dc}$ on the upper electrode side becomes, e.g., −100V. In this case, the plasma sheath has a small length $d_0$, as shown in FIG. 3A. On the other hand, where a DC voltage of −900V is applied to the upper electrode 34, $V_{dc}$ on the upper electrode side becomes −900V. In this case, since the length of the plasma sheath is in proportion to ¾ of the absolute value of $V_{dc}$, the plasma sheath has a larger length $d_1$, and the plasma is pressed by that much, as shown in FIG. 3B. Where the length of the plasma sheath is thus increased to suitably press the plasma, the effective residence time above the semiconductor wafer W is decreased. Further, the plasma concentrates above the wafer W with less diffusion, thereby reducing the dissociation space. In this case, dissociation of a fluorocarbon family process gas is suppressed for the photo-resist film to be less etched. Accordingly, the application voltage from the variable DC power supply 50 is preferably controlled by the controller 51, such that the length of the plasma sheath on the upper electrode 34 is increased to a level for forming desired pressed plasma. It should be noted that, also in this case, the application current or application power may be controlled in place of the application voltage from the variable DC power supply 50.

Further, when the plasma is formed, electrons are generated near the upper electrode 34. When a DC voltage is applied from the variable DC power supply 50 to the upper electrode 34, electrons are accelerated in the vertical direction within the process space due to the potential difference between the applied DC voltage value and plasma potential. In other words, the variable DC power supply 50 can be set at a desired polarity, voltage value, and current value, to irradiate the semiconductor wafer W with electrons. The radiated electrons reform the composition of the mask or photo-resist film to reinforce the film. Accordingly, the application voltage value and application current value from the variable DC power supply 50 can be used to control the quantity of electrons generated near the upper electrode 34 and the acceleration voltage for accelerating the electrons toward the wafer W, so that the photo-resist film is reinforced in a predetermined manner.

Particularly, where the photo-resist film on the semiconductor wafer W is a photo-resist film (which will be referred to as an ArF resist film) for an ArF excimer laser (with a wavelength of 193 nm), the ArF resist film changes its polymer structure through reactions shown in the following chemical formulas (1) and (2), and is then irradiated with electrons, thereby arriving at the structure shown on the right side of the following chemical formula (3). In this case, by the irradiation with electrons, the composition of the ArF resist film is reformed (resist cross-linkage reaction), as shown in a portion d of the chemical formula (3). Since this portion d has a function of greatly enhancing the etching resistance property (plasma resistance property), the etching resistance property of the ArF resist film remarkably increases. As a consequence, the surface roughness of the ArF resist film is suppressed, and the etching selectivity of an etching target layer relative to the ArF resist film is increased.

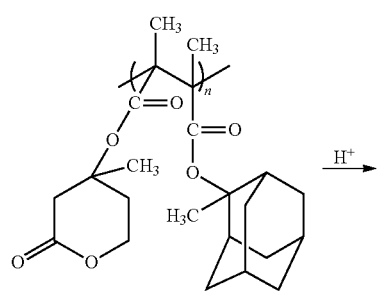

(1)

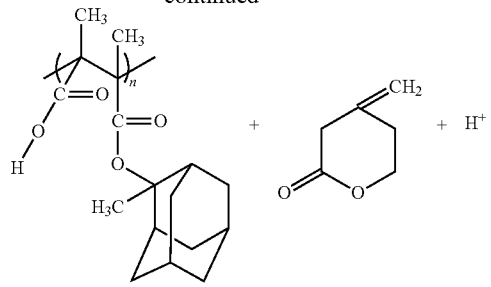

(2)

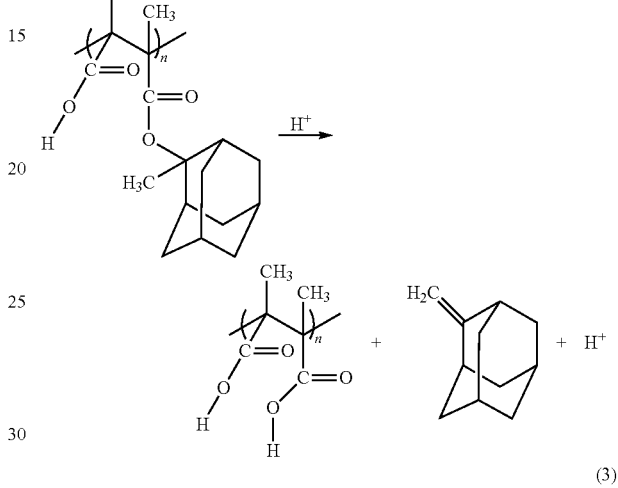

(3)

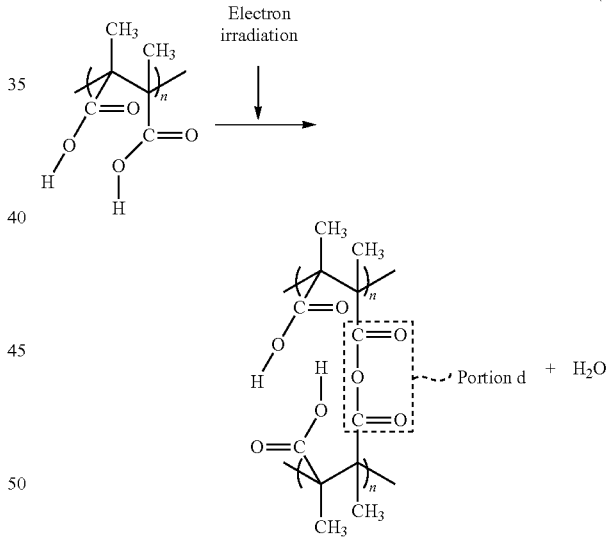

Accordingly, the application voltage value or current value from the variable DC power supply 50 is preferably controlled by the controller 51 to enhance the etching resistance property of the photo-resist film (particularly, ArF resist film) by irradiation with electrons.

Further, as described above, when a DC voltage is applied to the upper electrode 34, electrons generated near the upper electrode 34 in plasma generation are accelerated in the vertical direction within the process space. The polarity, voltage value, and current value of the variable DC power supply 50 can be set at predetermined conditions, so that electrons reach into holes formed on the semiconductor wafer W. As a consequence, the shading effect is suppressed to obtain a good processed shape without bowing, while improving the uniformity of the processed shape.

It is assumed that electron current amount $I_{DC}$ due to the DC voltage is used as the quantity of electrons incident on the wafer W, where the acceleration voltage of electrons is controlled. In this case, where $I_{ion}$ is ion current amount incident on the wafer from plasma, it is preferable to satisfy $I_{DC} > (\frac{1}{2}) I_{ion}$. Since $I_{ion} = Z\rho v_{ion} e$ (where, Z is charge number, $\rho$ is current velocity density, $v_{ion}$ is ion velocity, and e is electron charge amount $1.6 \times 10^{-19}$ C), and $\rho$ is in proportion to electron density Ne, $I_{ion}$ is in proportion to Ne.

As described above, the DC voltage applied to the upper electrode 34 can be controlled, so as to exercise the sputtering function onto the upper electrode 34 and the plasma pressing function, as well as the supply function of supplying a large quantity of electrons generated at the upper electrode 34 to the semiconductor wafer W, as described above. This arrangement makes it possible to reinforce the photo-resist film, supply optimum polymers, and suppress dissociation of the process gas. As a consequence, the surface roughness of the photo-resist is suppressed, and the etching selectivity of an etching target layer relative to the photo-resist film is increased. Further, the CD of an opening portion formed in the photo-resist film is prevented from expanding, thereby realizing pattern formation with high accuracy. Particularly, these effects are more enhanced by controlling the DC voltage to suitably exercise the three functions described above, i.e., the sputtering function, plasma pressing function, and electron supply function.

It should be noted that, it depends on process conditions or the like to determine which one of the functions described above is predominant. The voltage applied from the variable DC power supply 50 is preferably controlled by the controller 51 to exercise one or more of the functions to effectively obtain the corresponding effects.

The DC voltage applied to the upper electrode 34 can be adjusted to control the plasma potential. In this case, etching by-products can be prevented from being deposited on the upper electrode 34, the deposition shield 11 forming a part of the chamber wall, the inner wall member 26, and the insulating shield member 42.

If etching by-products are deposited on the upper electrode 34 or the deposition shield 11 forming the chamber wall, a problem may arise in that the process characteristics change or particles are generated. Particularly, there is involving sequentially etching a multi-layered film, in which an Si-organic film (SiOC), SiN film, SiO$_2$ film, and photo-resist are laminated on a semiconductor wafer W in this order. In this case, since suitable etching conditions are different for the respective films, a memory effect may occur in that a previous process leaves some effect that affects a subsequent process.

The amount of deposition of etching by-products described above depends on the potential difference between the plasma and the upper electrode 34, chamber wall, or the like. Accordingly, deposition of etching products can be suppressed by controlling the plasma potential.

As described above, the voltage applied from the variable DC power supply 50 to the upper electrode 34 can be controlled to lower the plasma potential. As a consequence, etching by-products can be prevented from being deposited on the upper electrode 34, the deposition shield 11 forming a part of the chamber wall, and the insulating members (members 26 and 42) inside the chamber 10. The plasma potential Vp is preferably set at a value within a range of $80V \leq Vp \leq 200V$.

Further, the applied DC voltage contributes to formation of plasma, as another effect obtained by the DC voltage applied to the upper electrode 34. In this case, the plasma density can be higher and the etching rate is thereby increased.

This is so, because, the negative DC voltage applied to the upper electrode hinders electrons from entering the upper electrode and thus suppresses extinction of electrons. Further, where the negative DC voltage accelerates ions onto the upper electrode, electrons are emitted from the electrode. These electrons are accelerated at a high velocity due to the difference between the plasma potential and application voltage value, and ionize neutral gas (turn the gas into plasma), thereby increasing the electron density (plasma density).

The reason for this will be explained, with reference to experiments.

Figure 6:
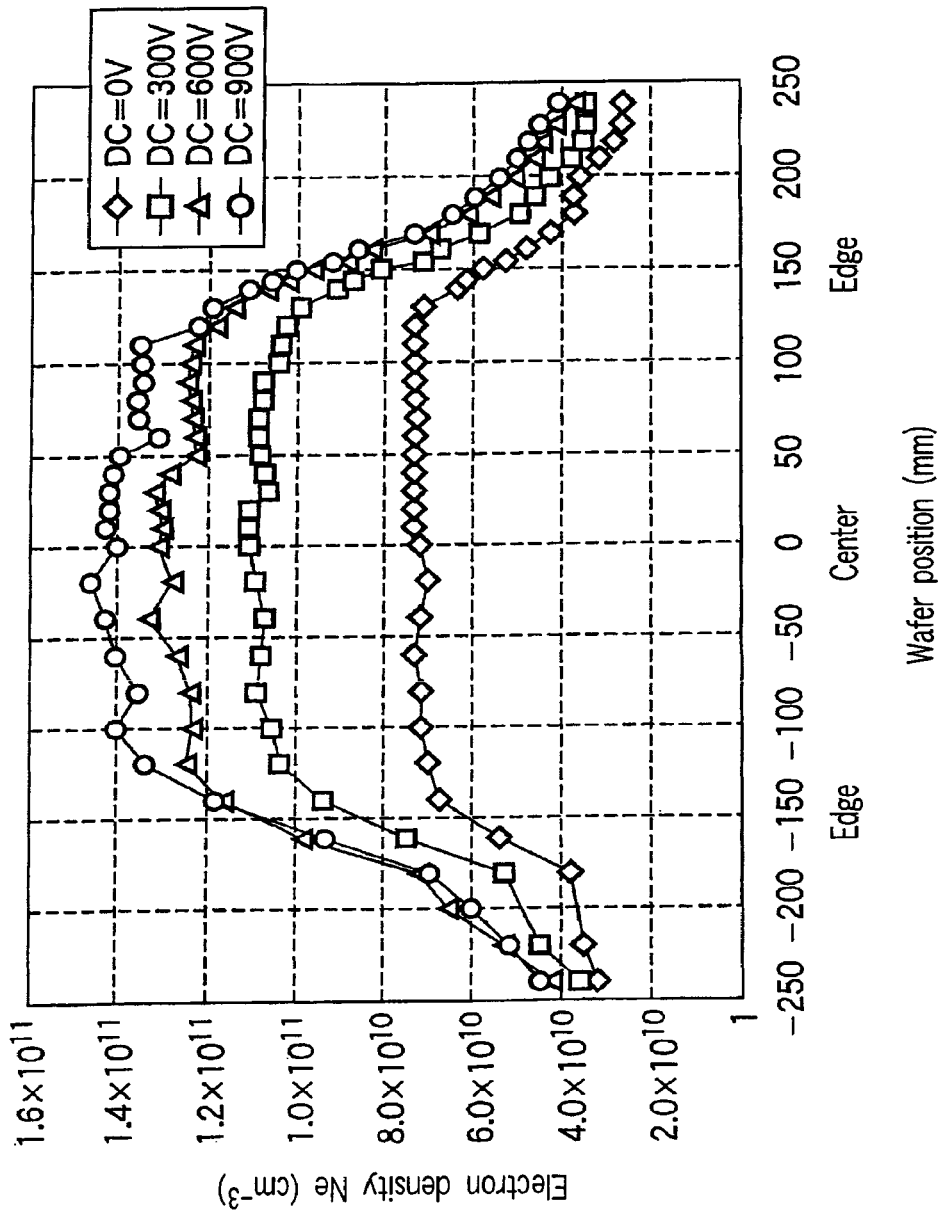
FIG. 6 is a view showing electron density distributions in the wafer radial direction where the HARC etching mentioned above employs a first RF power of 3,000 W and a second RF power of 4,000 W.

FIGS. 4A to 4D are views showing the relationship between the RF power output and electron density distribution. In this experiment, the absolute value of the negative DC voltage applied to the upper electrode was set at different values of 0V, 300V, 600V, and 900V, under HARC etching conditions in which the first RF power and the second RF power applied to the lower electrode or susceptor 16 had frequencies of 40 MHz and 3.2 MHz, respectively, and the pressure was set at 4 Pa. FIGS. 5A to 5D are views showing relationship between the RF power output and electron density distribution. In this experiment, the absolute value of the negative DC voltage applied to the upper electrode was set at different values of 0V, 300V 600V, and 900V, under VIA etching conditions in which the two RF powers had frequencies the same as those described above, and the pressure was set at 6.7 Pa. As shown in FIGS. 4A to 5D, with increase in the absolute value of the application DC voltage, the electron density (plasma density) increased. FIG. 6 is a view showing electron density distributions in the wafer radial direction where the first RF power was set at 3,000 W and the second RF power was set at 4,000 W under the HARC etching mentioned above. As shown in FIG. 6, with increase in the absolute value of the application DC voltage, the electron density increased.

Further, when plasma is generated, the DC voltage applied to the upper electrode 34 from the variable DC power supply 50 increases the plasma density particularly at the central portion in trench etching. As in trench etching conditions, where the pressure inside the chamber 10 is high and the etching gas is a negative gas, the plasma density tends to be lower at the central portion of the chamber 10. However, since the DC voltage applied to the upper electrode 34 increases the plasma density at the central portion, the plasma density can be controlled to make the plasma density uniform.

The reason for this will be explained, with reference to experiments.

Figure 7:
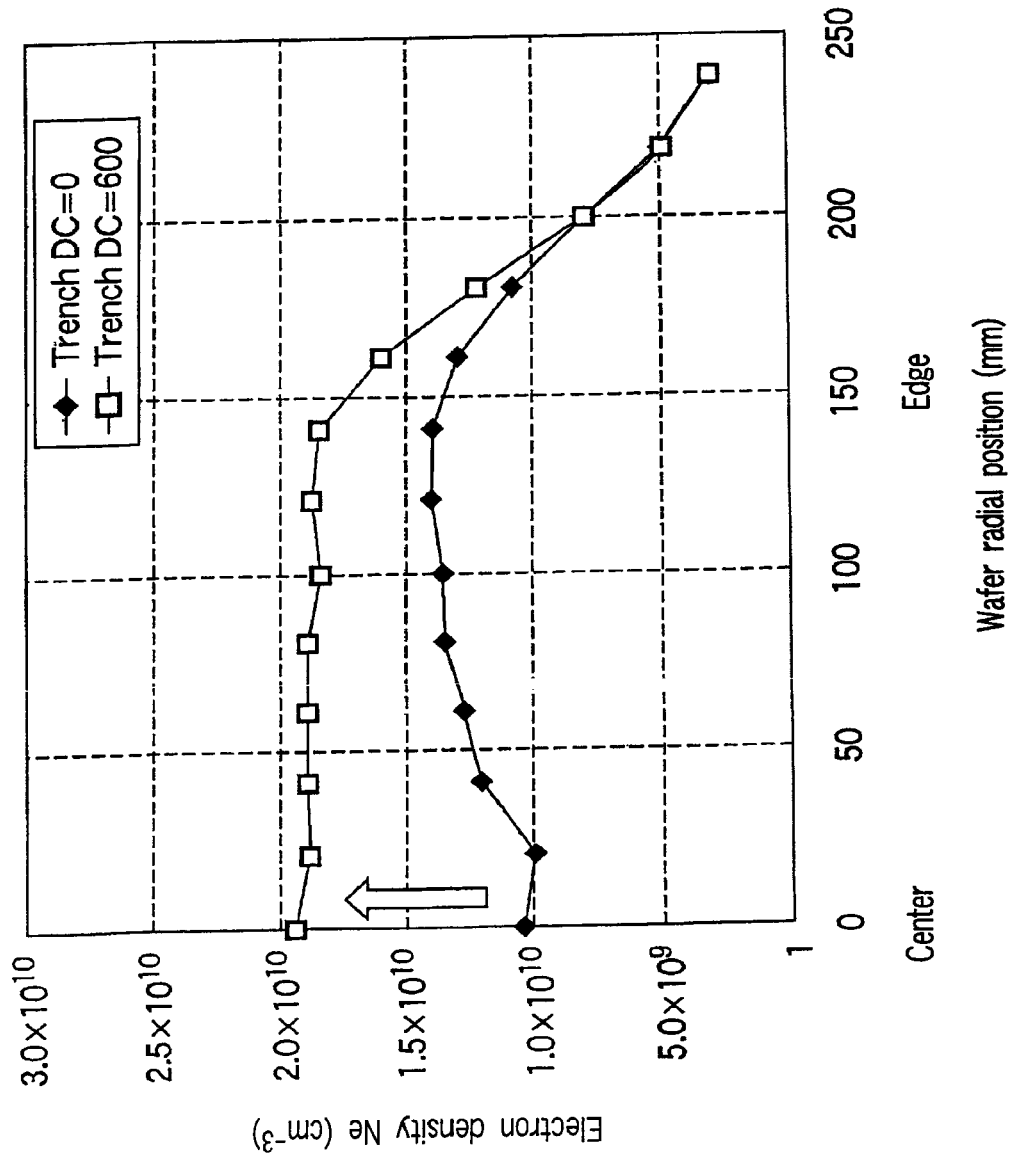
FIG. 7 is a view showing electron density distributions in the wafer radial direction where a DC voltage is applied and where no DC voltage is applied, under trench etching conditions.

In the apparatus shown in FIG. 2, the electron density (plasma density) distribution in the wafer radial direction was measure in cases where the upper electrode was supplied with no DC voltage and where it was supplied with −600 W, both under trench etching conditions. In order to set the trench etching conditions, a semiconductor wafer was loaded into the chamber and placed on the susceptor, and then a process gas comprising CF$_4$ gas, CHF$_3$ gas, Ar gas, and N$_2$ gas was supplied into the chamber, the pressure inside the chamber was set at 26.6 Pa, and the lower electrode or susceptor was supplied with a first RF power with 40 MHz at 300 W and a second RF power with 3.2 MHz at 1,000 W. FIG. 7 shows the results of this experiment. As shown in FIG. 7, where no DC voltage was applied, the electron density was lower at the wafer central portion than the other portions. On the other hand, where the DC voltage was applied, the electron density was increased at the wafer central portion and became uniform. Further, where the DC voltage was applied, the electron density was increased as a whole.

As described above, the DC voltage applied to the upper electrode 34 can be controlled, so as to effectively exercise at least one of the above-described sputtering function onto the upper electrode 34, plasma pressing function, electron supply function, plasma potential control function, electron density (plasma density) increase function, and plasma density control function.

As described above, an explanation has been given of functions and effects of the direct current (DC) voltage applied to the upper electrode 34.

Incidentally, in this embodiment, a DC voltage is applied to the upper electrode of a plasma etching apparatus in which a first radio frequency (RF) power for plasma generation and a second radio frequency (RF) power for ion attraction are applied to the lower electrode, i.e., an apparatus of the type that applies two RF powers with different frequencies to the lower side. Plasma etching apparatuses of the type that applies two RF powers with different frequencies to the lower side have the following advantages, as compared to the other plasma etching apparatus of the capacitive coupling type.

First, as in this embodiment, where an RF power for plasma generation is applied to the lower electrode, plasma is generated near the wafer, and dissociation of the process gas is suppressed because plasma is prevented from widely diffusing. As a consequence, even where the pressure inside the process chamber is high and the plasma density is low, the etching rate on the wafer can be increased. Further, even where the RF power for plasma generation has a high frequency, it is possible to ensure relatively large ion energy and thus attain a high efficiency. By contrast, in apparatuses of the type that applies an RF power for plasma generation to the upper electrode, plasma is generated near the upper electrode. In this case, it is difficult to increase the etching rate on the wafer, if the pressure inside the process chamber is high and the plasma density is low.

In addition, as in this embodiment, where an RF power for plasma generation and an RF power for ion attraction are independently applied to the lower electrode, the function of generating plasma and the function of attracting ions, both necessary for plasma etching, can be independently controlled. By contrast, in apparatuses of the type that applies an RF power with one frequency to the lower electrode, the function of generating plasma and the function of attracting ions cannot be independently controlled. In this case, it is difficult to satisfy etching conditions where high micro-fabrication is required.

As described above, according to a plasma etching apparatus of the type that applies two RF powers with different frequencies to the lower side, plasma is generated near the wafer and is prevented from widely diffusing, and the function of generating plasma and the function of attracting ions can be independently controlled. Further, where a DC voltage is applied to the upper electrode in this etching apparatus, the apparatus can also exercise at least one of the upper electrode sputtering function, plasma pressing function, electron supply (to a wafer) function, plasma potential control function, plasma density increase function, and plasma density control function. As a consequence, it is possible to provide a plasma etching apparatus with high performance, which is more suitable for recent etching micro-fabrication.

The DC voltage application to the upper electrode 34 may be selectively performed. Under etching conditions which require the DC voltage application to the upper electrode 34, the variable DC power supply 50 and the relay switch 52 shown in FIG. 2 are set in the ON-state. On the other hand, under etching conditions which do no require the DC voltage application to the upper electrode 34, the variable DC power supply 50 and relay switch 52 are set in the OFF-state.

Figure 8:
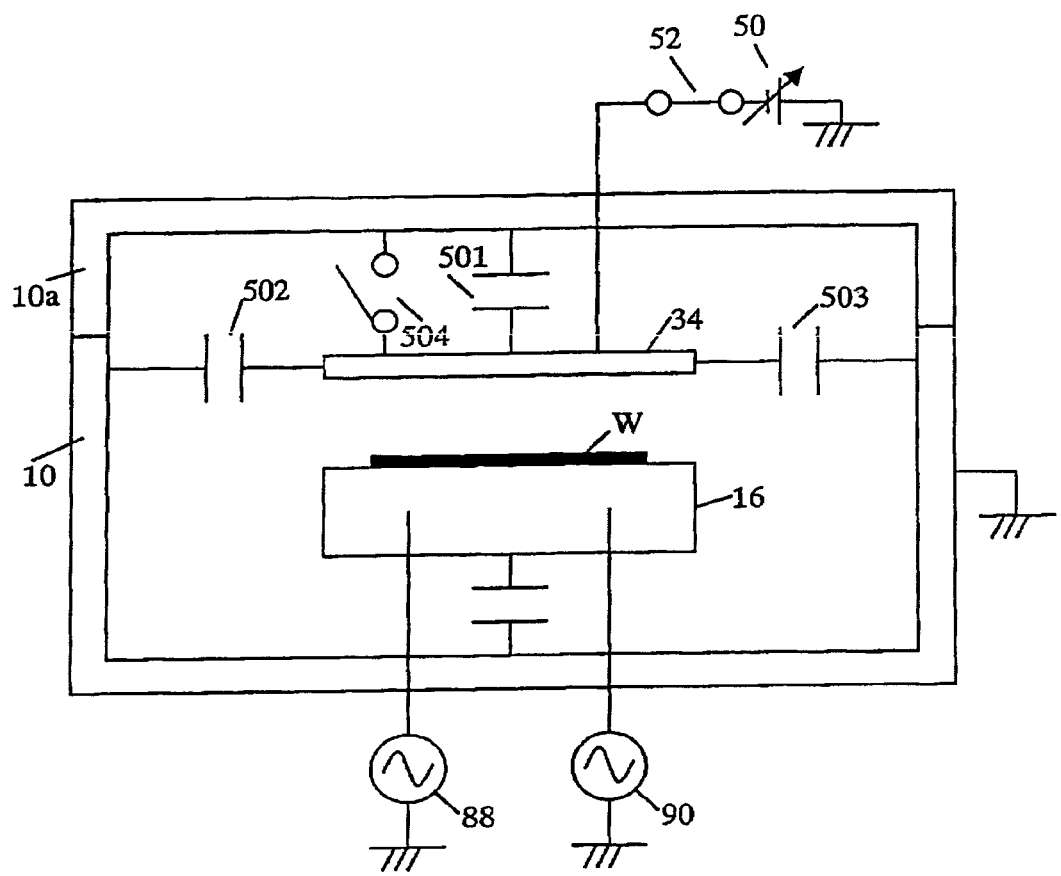
FIG. 8 is a view showing an electrical state of the upper electrode in the plasma etching apparatus shown in FIG. 2.
Figure 9:
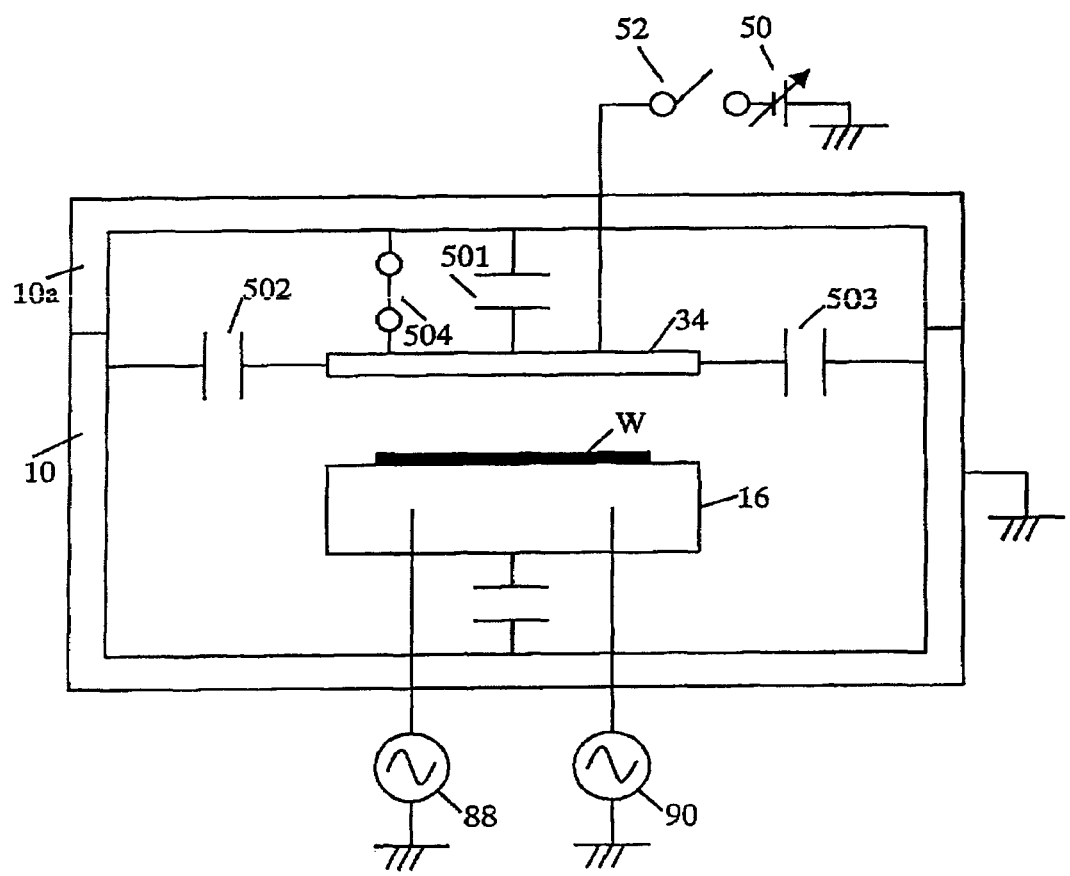
FIG. 9 is a view showing an electrical state of the upper electrode in the plasma etching apparatus shown in FIG. 2.

Further, if the upper electrode 34 is grounded when a DC voltage is applied to the upper electrode 34, the DC voltage application has no effect. Thus, the upper electrode 34 needs to be in a floating state in the sense of DC at this time. FIG. 8 shows a schematic view of this structure. In FIG. 8, a dielectric body is disposed at each of the portions that electrically form capacitors 501, 502, and 503, so that upper electrode 34 is set in a floating state in the sense of DC by the dielectric body from the process chamber 10 and grounded conductive body 10a. RF powers applied from the RF power supplies 88 and 89 to the lower electrode 16 reach the upper electrode 34 through the process space, and then reach the grounded process chamber 10 and grounded conductive body 10a through the capacitors 501, 502, and 503.

Where the variable DC power supply 50 and relay switch 52 are set in the OFF-state to apply no DC voltage to the upper electrode 34, the upper electrode 34 may be arranged to be switchable between the grounded state and floating state in the sense of DC. In the example shown in FIG. 9, where no DC voltage is applied to the upper electrode 34, the grounded conductive body 10a is short-circuited with the upper electrode 34 by a switch (switching unit) 504 to set the upper electrode 34 in a grounded state. However, at this time, the switch (switching unit) 504 may be turned off to set the upper electrode 34 in a floating state in the sense of DC.

Figure 10:
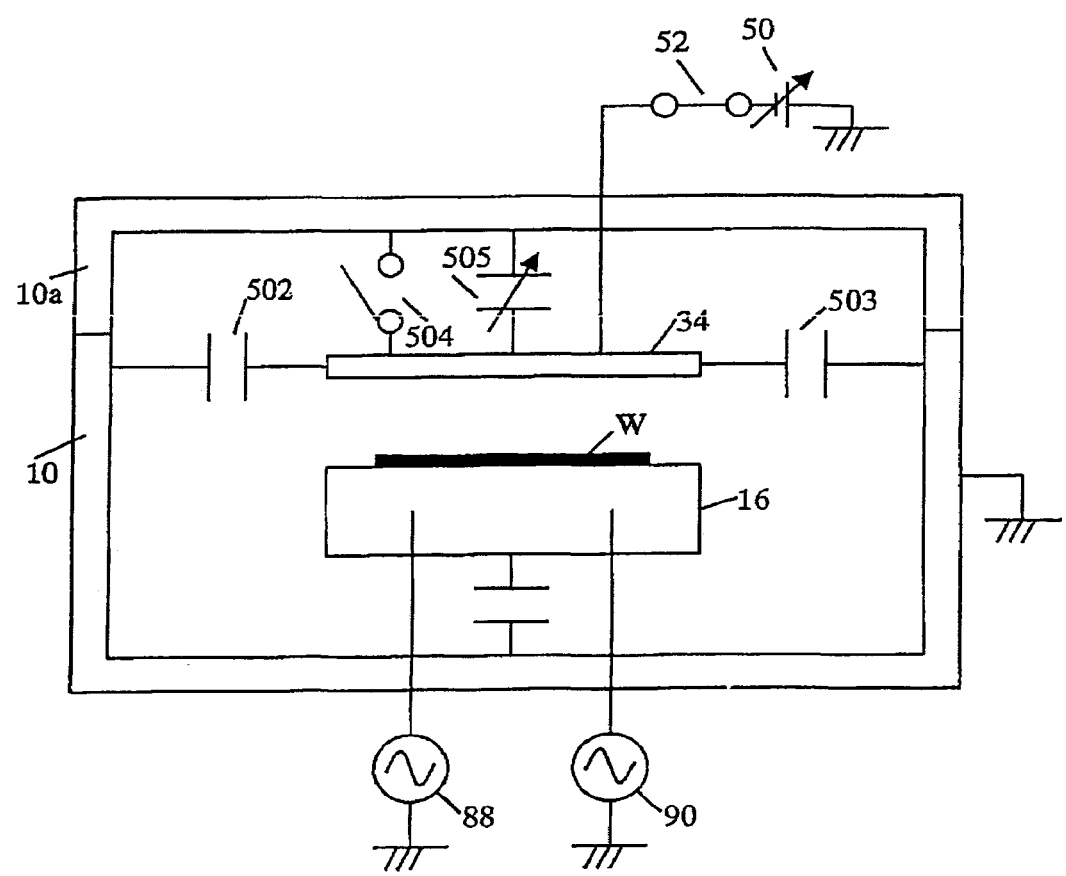
FIG. 10 is a view showing an electrical state of the upper electrode in the plasma etching apparatus shown in FIG. 2.

Further, as shown in FIG. 10, the portion electrically forming the capacitor 501 may be structured such that the capacitance is electrically variable. With this arrangement, the potential on the upper electrode can be variably adjusted.

Figure 11:
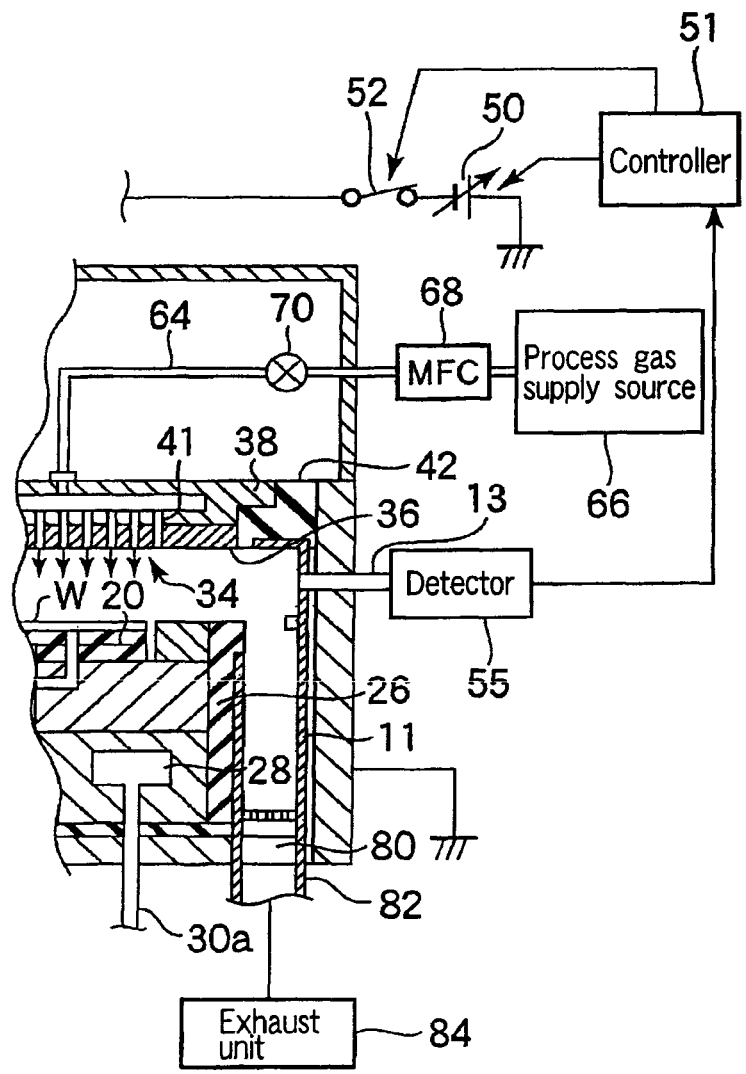
FIG. 11 is a sectional view showing a modification of the plasma etching apparatus shown in FIG. 2, provided with a detector for detecting plasma.

Further, as shown in FIG. 11, a detector 55 may be disposed to detect the plasma state through, e.g., a plasma detection window 10a, so that the controller 51 can control the variable DC power supply 50 based on the detection signal. As a consequence, it is possible to automatically apply a DC voltage to the upper electrode 34, so as to effectively exercise the functions described above. Alternatively, a detector for detecting the sheath length or a detector for detecting the electron density may be disposed, so that the controller 51 can control the variable DC power supply 50 based on the detection signal.

As regards a plasma etching apparatus of the type that applies two RF powers with different frequencies to the lower side, and further applies a DC voltage to the upper electrode, where the apparatus is used to etch an insulating film (for example, Low-k film) disposed on a wafer W, the following combination of gases is particularly preferably used as a process gas.

Specifically, where over etching is performed under via-etching conditions, a combination of ($C_5F_8$, Ar, and $N_2$), ($C_4F_8$, Ar, and $N_2$), ($C_4F_8$, Ar, $N_2$, and $O_2$), or ($C_4F_8$, Ar, $N_2$, and CO) may be preferably used as a process gas. In this case, the selectivity of an insulating film relative to an underlying film (SiC, SiN, etc.) can become larger.

Alternatively, where trench etching conditions are used, $CF_4$ or a combination of ($CF_4$ and Ar) or ($N_2$ and H2) may be preferably used as a process gas. In this case, the selectivity of an insulating film relative to a mask can become larger.

Alternatively, where conditions for etching an organic anti-reflection film on an insulating film are used, $CF_4$ or a combination of ($CF_4$ and $C_3F_8$), ($CF_4$ and $C_4F_8$), or ($CF_4$ and $C_4F_6$) may be preferably used as a process gas.

Alternatively, where HARC etching conditions are used, a combination of ($C_4F_6$, $CF_4$, Ar, and $O_2$), ($C_4F_6$, $C_3F_8$, Ar, and $O_2$), ($C_4F_6$, $C_4F_8$, Ar, and $O_2$), ($C_4F_6$, C2F6, Ar, and $O_2$), ($C_4F_8$, Ar, and $O_2$), or ($C_4F_8$, Ar, and $O_2$) may be preferably used as a process gas. In this case, the etching rate of an insulating film can become higher.

The process gas is not limited to the examples described above and another combination of (CxHyFz gas/additive gas such as $N_2$ or $O_2$/dilution gas) maybe used.

Incidentally, where a DC voltage is applied to the upper electrode 34, electrons may accumulate on the upper electrode 34 and thereby cause abnormal electric discharge between the upper electrode 34 and the inner wall of the chamber 10. In order to suppress such abnormal electric discharge, this embodiment includes the GND block (conductive member) 91 as a part grounded in the sense of DC, which is disposed on the deposition shield 11 that constitutes the chamber wall. The GND block 91 is exposed to plasma, and is electrically connected to a conductive portion in the deposition shield 11. The DC voltage current applied from the variable DC power supply 50 to the upper electrode 34 flows through the process space to the GND block 91, and is then grounded through the deposition shield 11. The GND block 91 is made of a conductor, and preferably a silicon-containing substance, such as Si or SiC. The GND block 91 may be preferably made of C. The GND block 91 allows electrons accumulated in the upper electrode 34 to be released, thereby preventing abnormal electric discharge. The GND block 91 preferably has a protruding length of 10 mm or more.

Figure 12:
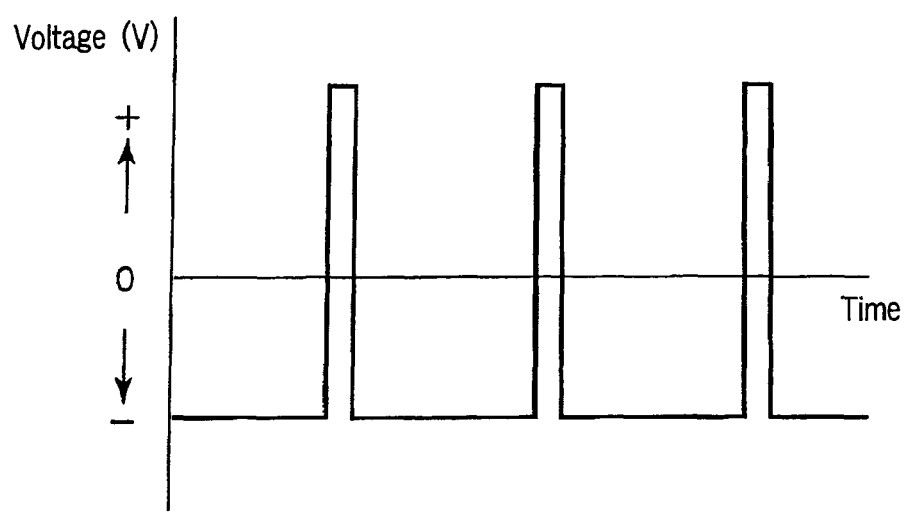
FIG. 12 is a view showing a waveform for suppressing abnormal electric discharge where a DC voltage is applied to the upper electrode in the plasma etching apparatus shown in FIG. 1.

Further, in order to prevent abnormal electric discharge, it maybe effective to use a method of super posing very short periodic pulses of the opposite polarity, as shown in FIG. 12, by a suitable means, with the DC voltage applied to the upper electrode 34, so as to neutralize electrons.

Figure 13:
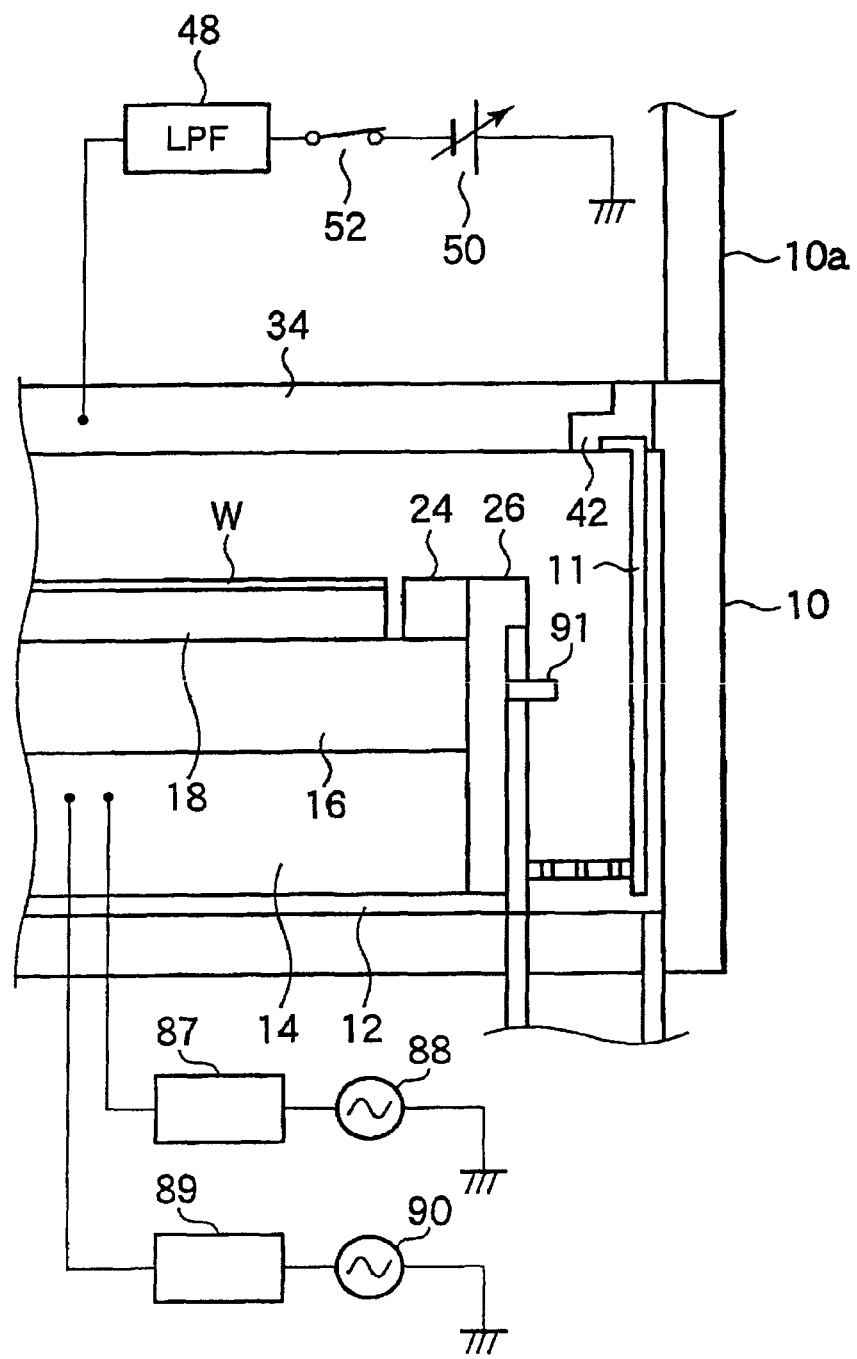
FIG. 13 is a schematic view showing another layout of a GND block.
Figure 14:
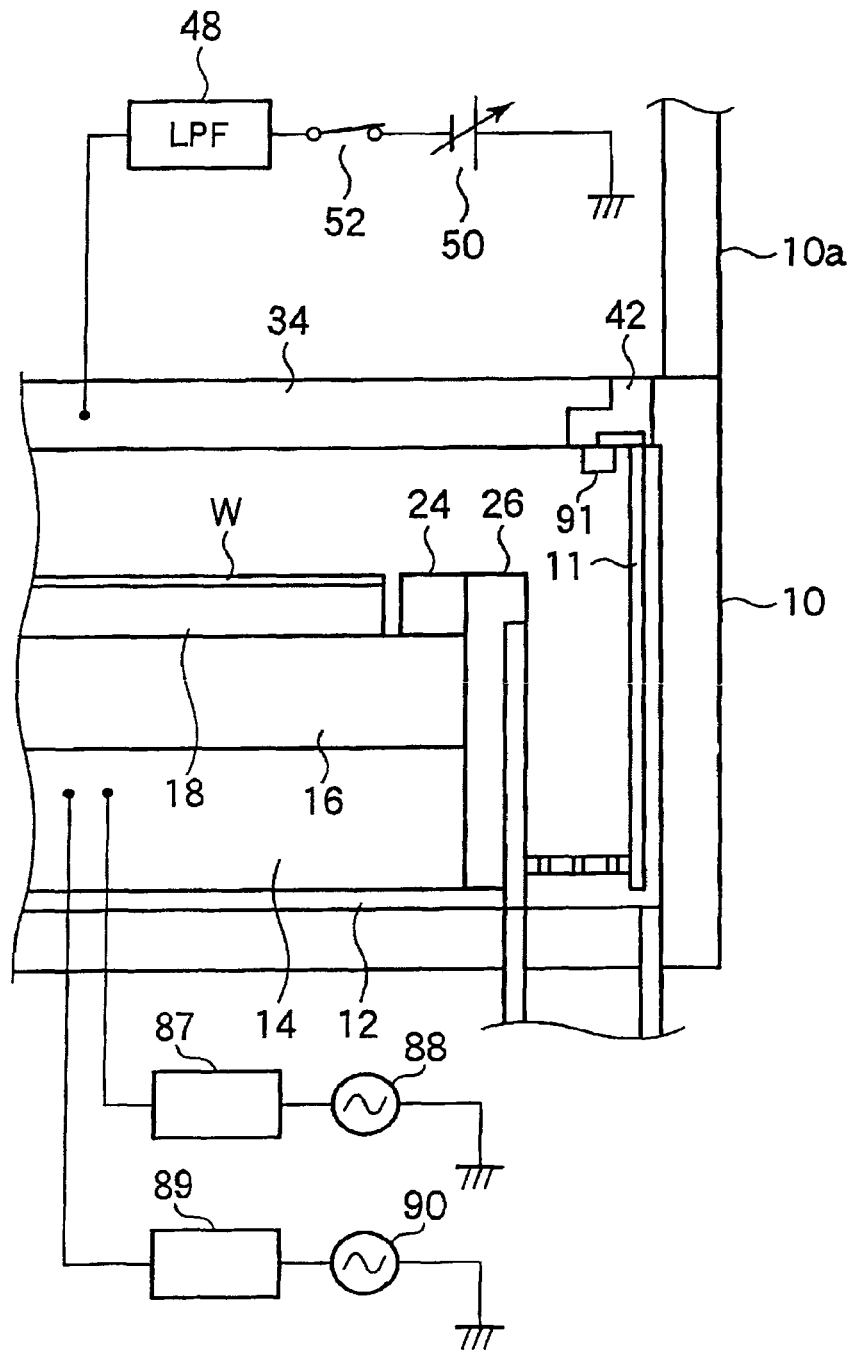
FIG. 14 is a schematic view showing another layout of the GND block.
Figure 15A:
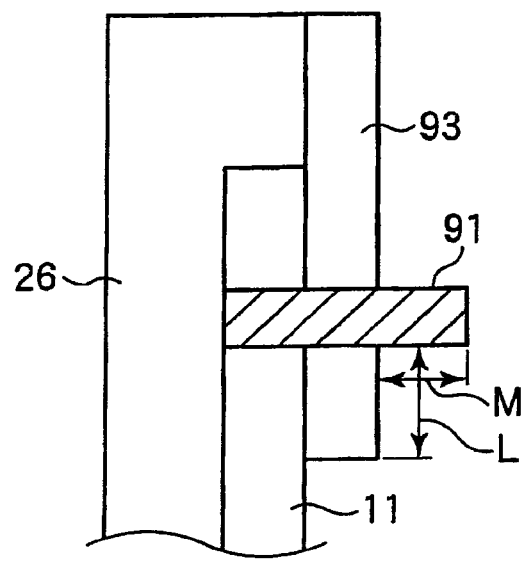
FIGS. 15A and 15B are views showing structures for preventing deposition on the GND block.
Figure 15B:
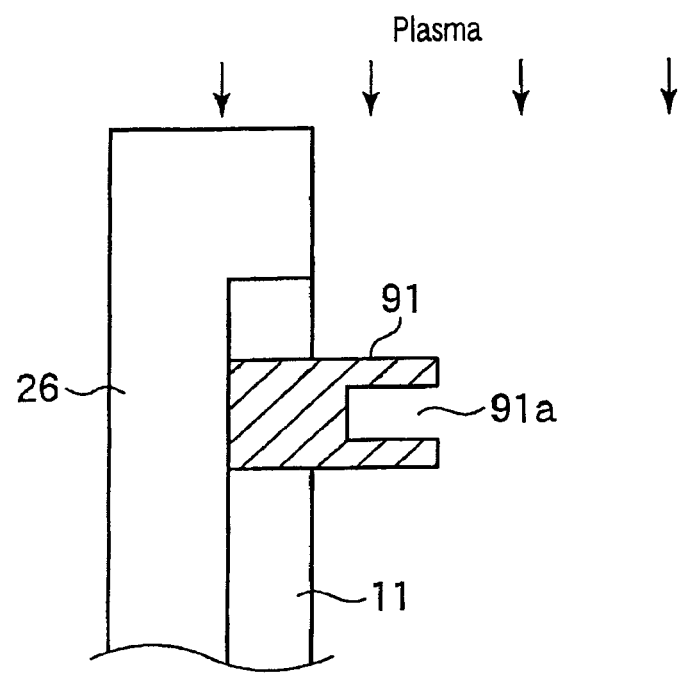

The position of the GND block 91 is not limited to that shown in FIG. 2, as long as it is disposed in the plasma generation area. For example, as shown in FIG. 13, the GND block 91 may be disposed on the susceptor 16 side, e.g., around the susceptor 16. Alternatively, as shown in FIG. 14, the GND block 91 may be disposed near the upper electrode 34, e.g., as a ring disposed outside the upper electrode 34. However, when plasma is generated, $Y_2O_3$ or a polymer that covers the deposition shield 11 or the like flies out and may be deposited on the GND block 91. In this case, the GND block 91 cannot maintain the grounding performance anymore in the sense of DC, and thus hardly exercises the effect of preventing abnormal electric discharge. Accordingly, it is important to prevent such deposition. For this reason, the GND block 91 is preferably located at a position remote from members covered with $Y_2O_3$ or the like, but preferably near parts made of an Si-containing substance, such as Si or quartz ($SiO_2$). For example, as shown in FIG. 15A, an Si-containing member 93 is preferably disposed near the GND block 91. In this case, the length L of a portion of the Si-containing member 93 below the GND block 91 is preferably set to be equal to or longer than the protruding length M of the GND block 91. Further, in order to prevent the function from being deteriorated due to deposition of $Y_2O_3$ or a polymer, as shown in FIG. 15B, it is effective to form a recess 91a in the GND block 91 where flying substances are hardly deposited. It is also effective to increase the surface are of the GND block 91, so that it cannot be entirely covered with $Y_2O_3$ or a polymer. Further, in order to suppress deposition, it is effective to increase the temperature. In this respect, the upper electrode 34 is supplied with an RF power for plasma generation, and thus increases the temperature around it. Accordingly, the GND block 91 is preferably disposed near the upper electrode 34, as shown in FIG. 14, to increase the temperature and thereby prevent deposition. Particularly in this case, the GND block 91 is preferably disposed as a ring outside the upper electrode 34, as shown in FIG. 14.

Figure 16:
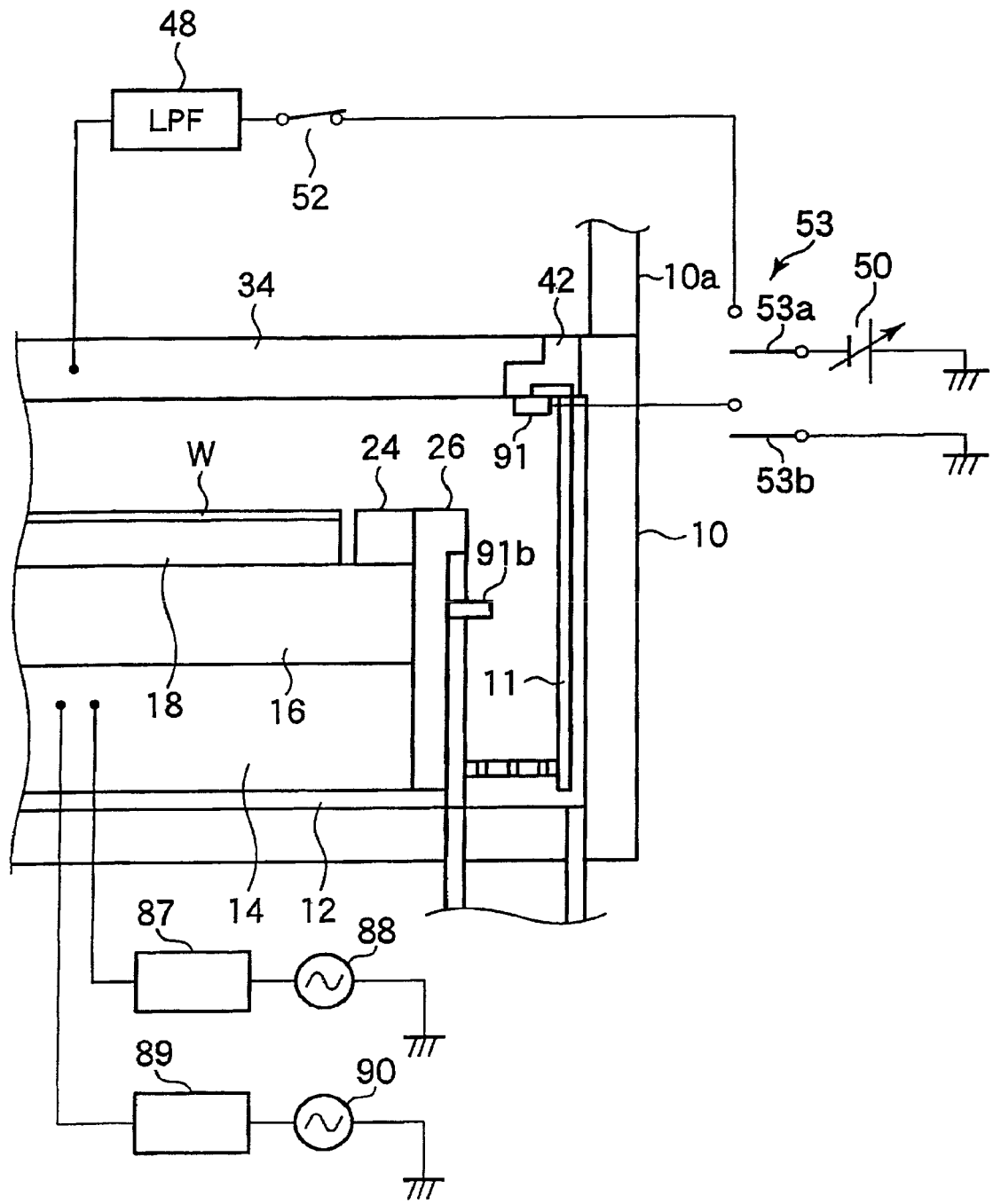
FIG. 16 is a schematic view showing an example of a device that can remove deposition on the GND block.

In order to more effectively remove the influence of deposition on the GND block 91, due to $Y_2O_3$ or a polymer flying out from the deposition shield 11 and so forth, it is effective to make a negative DC voltage applicable to the GND block 91, as shown in FIG. 16. Specifically, where a negative DC voltage is applied to the GND block 91, deposition sticking there to is sputtered or etched, so as to clean the surface of the GND block 91. In the structure shown in FIG. 16, a switching mechanism 53 is configured to switch the connection of the GND block 91 between the variable DC power supply 50 and a ground line, so that a voltage can be applied to the GND block 91 from the variable DC power supply 50. Further, a grounded conductive auxiliary member 91b is disposed to receive flow of a DC electron current generated by a negative DC voltage applied to the GND block 91. The switching mechanism 53 includes a first switch 53a to switch the connection of the variable DC power supply 50 between the matching unit 46 and GND block 91, and a second switch 53b to turn on/off the connection of the GND block 91 to the ground line. In the structure shown in FIG. 16, the GND block 91 is disposed as a ring outside the upper electrode 34, while the conductive auxiliary member 91b is disposed around the susceptor 16. Although this arrangement is preferable, another arrangement may be adopted.

During plasma etching, the structure shown in FIG. 16 is typically set as shown in FIG. 17A, in which the first switch 53a of the switching mechanism 53 is connected to the upper electrode 34, so the variable DC power supply 50 is connected to the upper electrode 34, while the second switch 53b is in the ON-state, so the GND block 91 is connected to the ground line. In this state, the first RF power supply 48 and variable DC power supply 50 are electrically connected to the upper electrode 34, and plasma is thereby generated. At this time, a DC electron current flows from the upper electrode 34 through plasma into the grounded GND block 91 and conductive auxiliary member 91b (a positive ion current flows in the opposite direction). In this case, the surface of the GND block 91 maybe covered with deposition of $Y_2O_3$ or a polymer, as described above.

Accordingly, cleaning is then performed to remove this deposition. For this cleaning, as shown in FIG. 17B, the first switch 53a of the switching mechanism 53 is switched to the GND block 91, and the second switch 53b is turned off. In this state, the first RF power supply 48 is electrically connected to the upper electrode 34, and cleaning plasma is thereby generated, while a negative DC voltage is applied from the variable DC power supply 50 to the GND block 91. As a consequence, a DC electron current flows from the GND block 91 into the conductive auxiliary member 91b. On the other hand, positive ions flow into the GND block 91. Accordingly, the DC voltage can be adjusted to control the energy of positive ions incident on the GND block 91, so that the surface of the GND block 91 is sputtered by ions to remove deposition sticking to the surface of the GND block 91.

Figure 18:
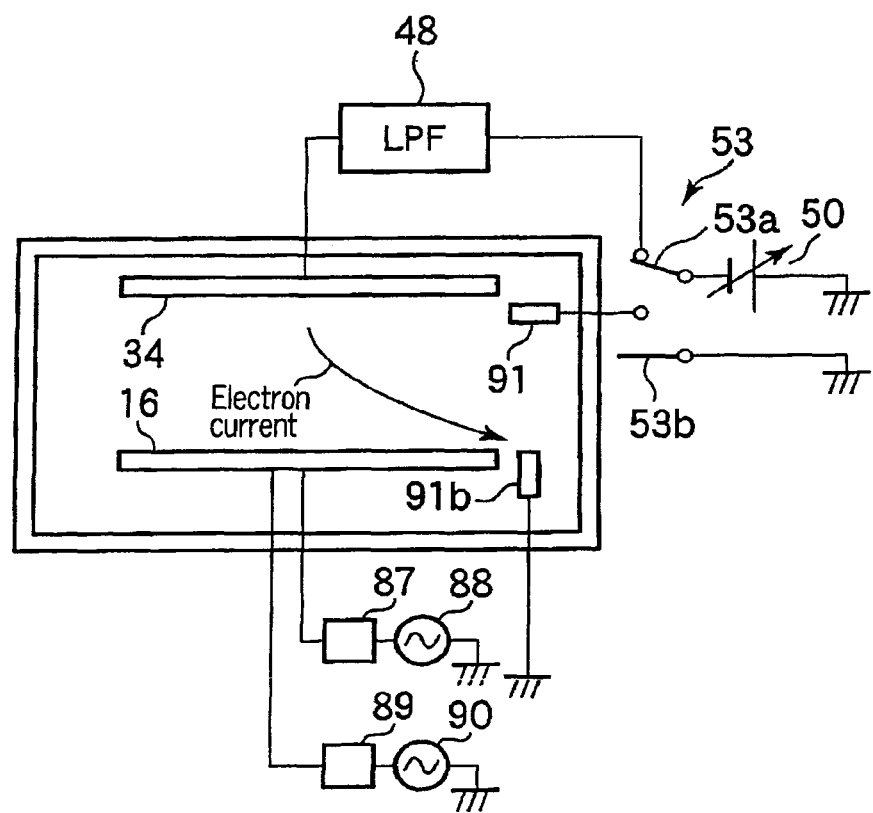
FIG. 18 is a schematic view showing another state in plasma etching of the device shown in FIG. 16.

Further, as shown in FIG. 18, the second switch 53b may be set in the OFF state during a partial period of plasma etching, so that the GND block 91 is in a floating state. At this time, a DC electron current flows from the upper electrode 34 through plasma into the conductive auxiliary member 91b (a positive ion current flows in the opposite direction). In this case, the GND block 91 is given a self bias voltage, which provides energy for positive ions to be incident on the GND block 91, thereby cleaning the GND block 91.

During the cleaning described above the application DC voltage can be small, and thus the DC electron current is also small at this time. Accordingly, in the structure shown in FIG. 16, where electric charges due to leakage current can be prevented from accumulating in the GND block 91, the conductive auxiliary member 91b is not necessarily required.

Figure 19:
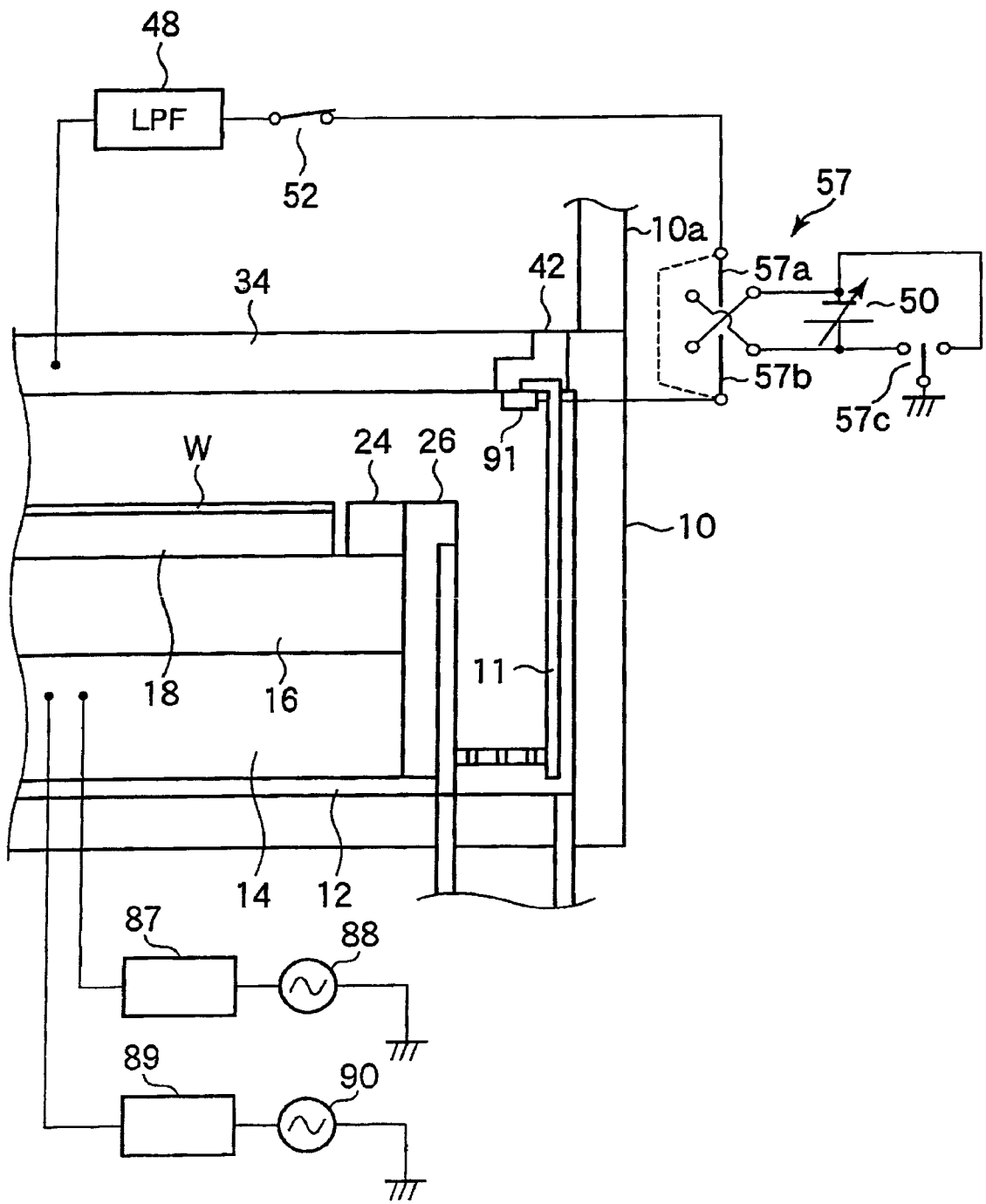
FIG. 19 is a schematic view showing another example of a device that can remove deposition on the GND block.

In the structure shown in FIG. 16, for cleaning, the connection of the variable DC power supply 50 is switched from the upper electrode 34 to the GND electrode 91, so that a DC electron current due to application of a DC voltage flows from the GND block 91 to the conductive auxiliary member 91b. Alternatively, it may be adopted that the positive terminal of the variable DC power supply 50 is connected to the upper electrode 34, while the negative terminal is connected to the GND block 91, so that a DC electron current due to application of a DC voltage flows from the GND block 91 to the upper electrode 34. In this case, the conductive auxiliary member is not necessary. FIG. 19 shows such a structure. The structure shown in FIG. 19 includes a connection switching mechanism 57, which is configured to perform connection switching such that, during plasma etching, the negative terminal of the variable DC power supply 50 is connected to the upper electrode 34, while the GND block 91 is connected to the ground line. Further, in this switching, during cleaning, the positive terminal of the variable DC power supply 50 is connected to the upper electrode 34, while the negative terminal is connected to the GND block 91. This connection switching mechanism 57 includes a first switch 57a to switch the connection of the variable DC power supply 50 to the upper electrode 34 between the positive terminal and negative terminal, a second switch 57b to switch the connection of the variable DC power supply 50 to the GND block 91 between the positive terminal and negative terminal, and a third switch 57c to set the positive terminal or negative terminal of the variable DC power supply 50 to be grounded. The first switch 57a and second switch 57b are arranged to form an interlock switch structure. Specifically, when the first switch 57a is connected to the positive terminal of the variable DC power supply 50, the second switch 57b is connected to the negative terminal of the DC power supply. Further, when the first switch 57a is connected to the negative terminal of the variable DC power supply 50, the second switch 57b is set in the OFF state.

Figure 20A:
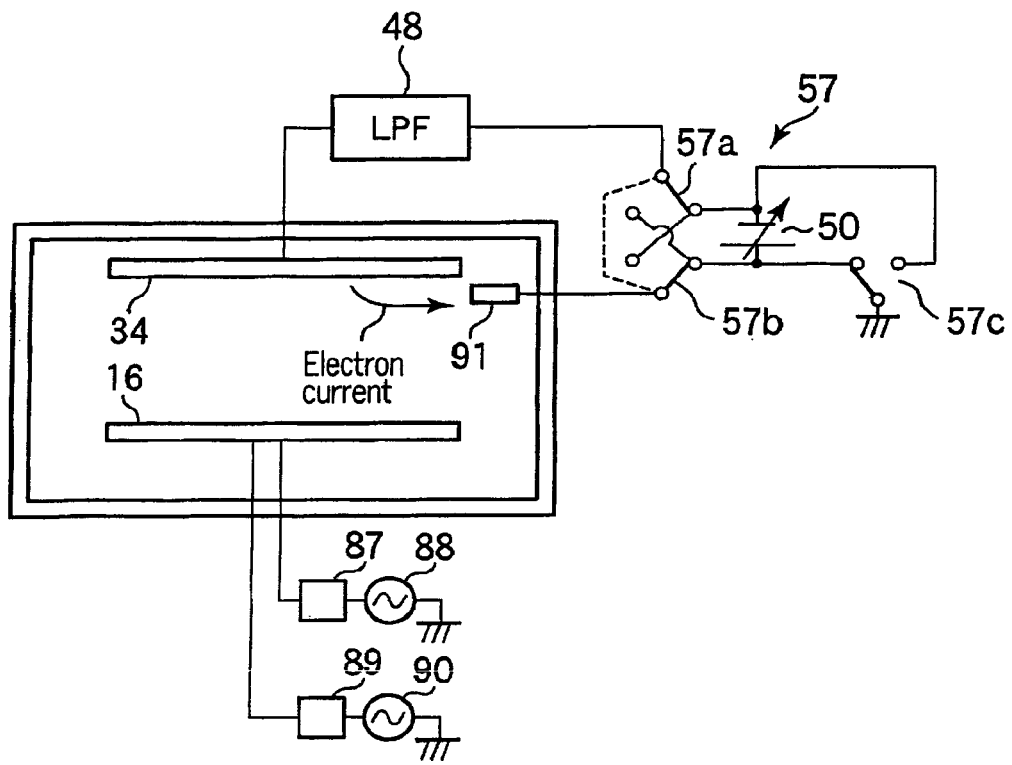
FIGS. 20A and 20B are schematic views showing a state in plasma etching and a state in cleaning, respectively, of the device shown in FIG. 19.

During plasma etching, the structure shown in FIG. 19 is set as shown in FIG. 20A, in which the first switch 57a of the connection switching mechanism 57 is connected to the negative terminal of the variable DC power supply 50, so the negative terminal of the variable DC power supply 50 is connected to the upper electrode 34. Further, the second switch 57b is connected to the positive terminal of the variable DC power supply 50, and the third switch 57c is connected to the positive terminal of the variable DC power supply 50 (the positive terminal of the variable DC power supply 50 is grounded), so that the GND block 91 is connected to the ground line. In this state, the first RF power supply 48 and variable DC power supply 50 are electrically connected to the upper electrode 34, and plasma is thereby generated. At this time, a DC electron current flows from the upper electrode 34 through plasma into the grounded GND block 91 (a positive ion current flows in the opposite direction). In this case, the surface of the GND block 91 may be covered with deposition of $Y_2O_3$ or a polymer, as described above.

Figure 20B:
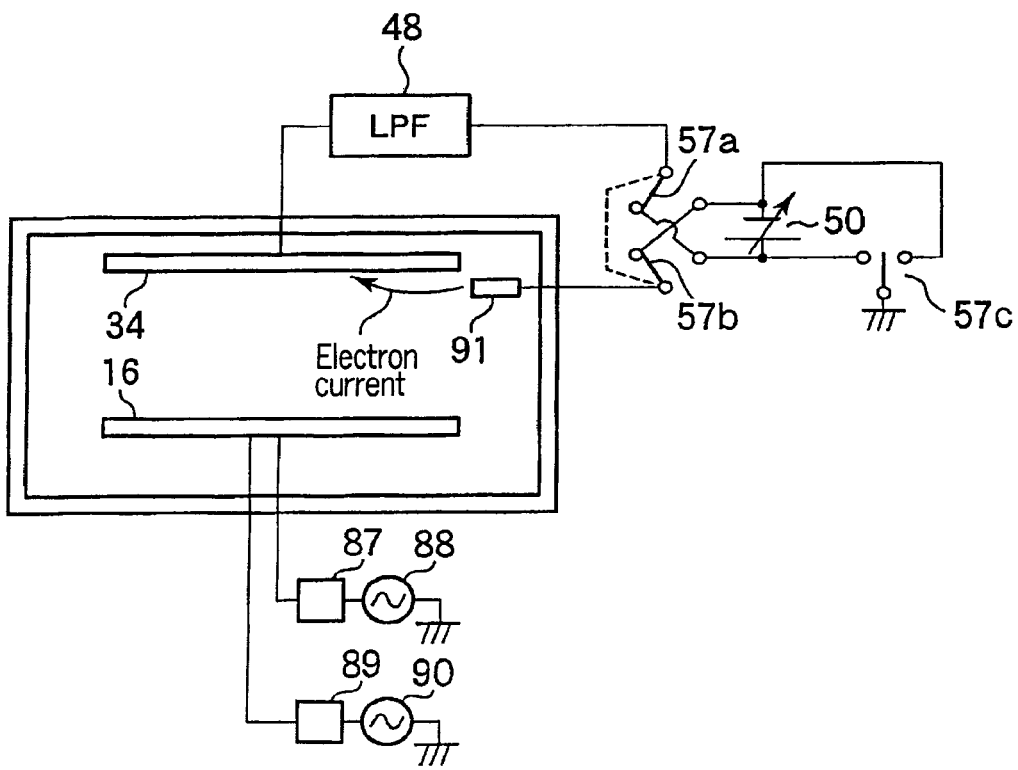

On the other hand, for cleaning, as shown in FIG. 20B, the first switch 57a of the connection switching mechanism 57 is switched to the positive terminal of the variable DC power supply 50, the second switch 57b is switched to the negative terminal of the variable DC power supply 50, and the third switch 57c is set to be in a disconnected state. In this state, the first RF power supply 48 is electrically connected to the upper electrode 34, and cleaning plasma is thereby generated, while a DC voltage is applied to the GND block 91 from the negative terminal of the variable DC power supply 50 and to the upper electrode 34 from the positive terminal of the variable DC power supply 50. Due to the potential difference between these members, a DC electron current flows from the GND block 91 into the upper electrode 34, while positive ions flow into the GND block 91. Accordingly, the DC voltage can be adjusted to control the energy of positive ions incident on the GND block 91, so that the surface of the GND block 91 is sputtered by ions to remove deposition sticking to the surface of the GND block 91. In this case, the variable DC power supply 50 appears to be in a floating state, but, in general, a power supply is provided with a frame ground line, thus is safe.

In the example described above, although the third switch 57c is in the disconnected state, the positive terminal of the variable DC power supply 50 may be kept in the connected state (the positive terminal of the variable DC power supply 50 is grounded). In this state, the first RF power supply 48 is electrically connected to the upper electrode 34, and cleaning plasma is thereby generated, while a DC voltage is applied from the negative terminal of the variable DC power supply 50 to the GND block 91. As a consequence, a DC electron current flows from the GND block 91 into the upper electrode 34 through plasma, while positive ions flows into the GND block 91. Also in this case, the DC voltage can be adjusted to control the energy of positive ions incident on the GND block 91, so that the surface of the GND block 91 is sputtered by ions to remove deposition sticking to the surface of the GND block 91.

In the examples shown in FIGS. 16 and 19, although a DC voltage is applied to the GND block 91 during cleaning, an AC voltage may be alternatively applied. Further, in the example shown in FIG. 16, although the variable DC power supply 50 for applying a DC voltage to the upper electrode is used for applying a voltage to the GND block 91, another power supply maybe used for applying the voltage. Furthermore, in the examples shown in FIGS. 16 and 19, although the GND block 91 is grounded during plasma etching, while a negative DC voltage is applied to the GND block 91 during cleaning, this is not limiting. For example, during plasma etching, a negative DC voltage may be applied to the GND block 91. The term, "during cleaning" maybe replaced with "during ashing" in the explanation described above. Furthermore, where the variable DC power supply 50 is formed of a bipolar power supply, it does not require any complex switching operation, such as that of the connection switching mechanism 57 described above.

The switching operations of the switching mechanism 53 of the example shown in FIG. 16 and the connection switching mechanism 57 of the example shown in FIG. 19 are performed in accordance with commands sent from the control section 95.

In order to simply prevent the GND block 91 from losing the grounding performance in the sense of DC, due to deposition of $Y_2O_3$ or a polymer on the GND block 91 in plasma generation, it is effective to partly cover the GND block 91 with another member, and to move them relative to each other so as to expose a new surface of the GND block 91. Specifically, as shown in FIG. 21, it maybe adopted that the GND block 91 is set to have a relatively large area, and the surface of the GND block 91 to be in contact with plasma is partly covered with a mask member 111 movable in the arrow direction. This cover plate 111 is movable, so that a portion to be exposed to plasma can be changed on the surface of the GND block 91. In this case, although a driving mechanism disposed in the chamber 10 may cause a problem about particle generation, it cannot be serious because the frequency of use of the driving mechanism is as slow as once in 100 hours. Further, for example, as shown in FIG. 22, it may be effective that a columnar GND block 191 is rotatably disposed, and the outer periphery surface of the GND block 191 is covered with a mask member 112, so that it is partially exposed. Where the GND block 191 is rotated, the portion to be exposed to plasma can be changed. In this case, a driving mechanism may be disposed outside the chamber 10. Each of the mask members 111 and 112 may be formed of a member having a high plasma resistance property, such as an aluminum plate covered with a ceramic, such as $Y_2O_3$, formed by thermal spray.

In order to simply prevent the GND block 91 from losing the grounding performance in the sense of DC due to deposition, it is also effective to partly cover the GND block 91 with another member, which is to be gradually etched by plasma, so that a part of the surface of the GND block 91, which has not lost conductivity, is always exposed. For example, as shown in FIG. 23A, it maybe adopted that the surface of the GND block 91 is partly covered with a stepped cover film 113 disposed to leave an initially exposed surface 91c that provides a grounding performance. In this case, after a plasma process is performed for, e.g., 200 hours, the initially exposed surface 91c of the GND block 91 loses conductivity, as shown in FIG. 23B. However, the stepped cover film 113 is designed to have a thin portion such that it has been etched by this time, so that a new exposed surface 91d of the GND block 91 appears. The new exposed surface 91d provides a grounding performance. This cover film 113 has the effect of preventing a wall surface material from being deposited on the GND block 91, as well as the effect of reducing ions incident on the GND block 91 to prevent contamination thereof.

In practical use, as shown in FIG. 24, it is preferable to use a cover film 113a in which a number of thin layers 114 are stacked while the layers are gradually shifted. In this case, where one layer 114 disappears due to etching by plasma in a time Te, and an exposed surface of the GND block 91 loses conductivity due to contamination in a time Tp, the thickness of the layer 114 is set to satisfy Te<Tp, so that a conductive surface is always ensured on the GND block 91. The number of layers 114 is preferably set to make the service life of the GND block 91 longer than the frequency of maintenance. Further, in order to improve the maintenance performance, one layer 114a is provided with a different color from the others, as shown in FIG. 24, so that it is possible to know the time to replace the GND block 91 with a new one, by this film 114a, for example, when the surface area of this film 114a exceeds a certain value.

Each of the cover films 113 and 113a is preferably formed of a film to be suitably etched by plasma, such as a photo-resist film.

In order to simply prevent the GND block 91 from losing the grounding performance in the sense of DC due to deposition, it may be also adopted to dispose a plurality of GND blocks 91, so that they are switched in turn to exercise a grounding performance. For example, as shown in FIG. 25, three GND blocks 91 are disposed and only one of them is selectively grounded by a shift switch 115. Further, a current sensor 117 is disposed on a common ground line 116 to monitor a DC current flowing there through. The current sensor 117 is used to monitor a current flowing through a grounded GND block 91, and when the current value becomes lower than a predetermined value, it is determined that this GND block 91 cannot exercise the grounding performance, and thus the connection is switched from this one to another GND block 91. The number of GND blocks 91 is suitably selected from a range of about 3 to 10.

Figure 26:
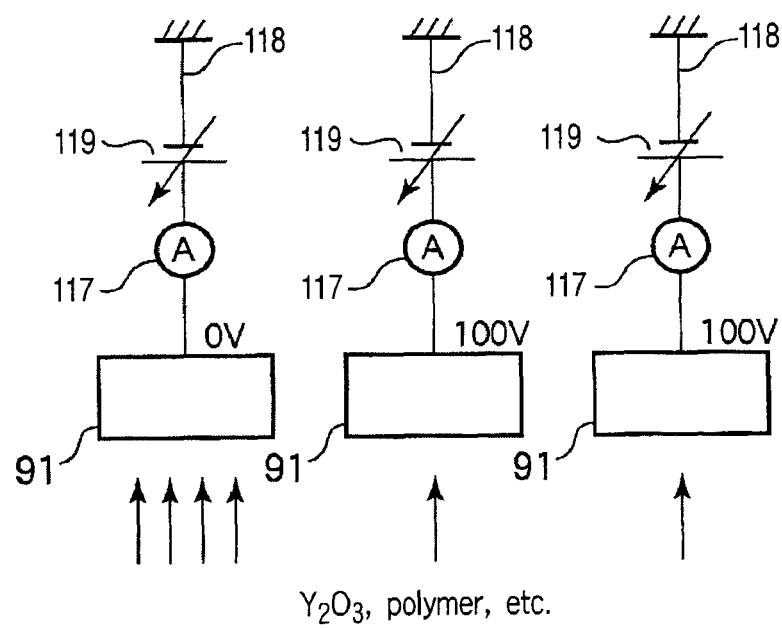
FIG. 26 is a schematic view showing another example of the GND block having a function to prevent it from losing the grounding performance in the sense of DC.

In the example described above, a GND block not grounded is in an electrically floating state, but such a GND block maybe supplied with an electric potential for protection to protect a GND block in an idle state, in place of use of the shift switch 115. FIG. 26 shows an example designed in this aspect. As shown in FIG. 26, each of ground lines 118 respectively connected to GND blocks 91 is provided with a variable DC power supply 119. In this case, the voltage of a GND block 91 to exercise a grounding performance is set at 0V by controlling the voltage of the corresponding variable DC power supply 119. Further, the voltage of each of the other GND blocks 91 is set at, e.g., 100V to prevent an electric current from flowing there through by controlling the voltage of the corresponding variable DC power supply 119. When the current value detected thereby becomes lower than a predetermined value at the current sensor 117 on the ground line 118 connected to a GND block 91 to exercise a grounding performance, it is determined that this GND block 91 cannot exercise the grounding performance. Accordingly, the voltage of the variable DC power supply 119 corresponding to another GND block 91 is controlled to be a value for this GND block 91 to exercise a grounding performance.

As described above, where the application voltage from a DC power supply 119 is set at a negative value of about −1 kV, the GND block 91 connected there to can function as an electrode to apply a DC voltage to plasma. However, if this value is too large, the plasma is affected. Further, the voltage applied to the GND block 91 can be controlled to obtain a cleaning effect on the GND block 91.

In this embodiment, the first RF power and second RF power may have frequencies, as follows. Specifically, the frequency of the first RF power may be one of 13.56 MHz, 27 MHz, 40 MHz, 60 MHz, 80 MHz, 100 MHz, and 160 MHz, while the frequency of the second RF power may be one of 380 kHz, 800 kHz, 1 MHz, 2 MHz, 3.2 MHz, and 13.56 MHz. They are suitably combined in accordance with a process to be performed.

The embodiment described above is exemplified by a plasma etching apparatus, but it may be applied to other apparatuses that utilize plasma to process a semiconductor substrate, such as a plasma film formation apparatus.

Additional advantages and modifications will readily occur to those skilled in the art. Therefore, the invention in its broader aspects is not limited to the specific details and representative embodiments shown and described herein. Accordingly, various modifications maybe made without departing from the spirit or scope of the general inventive concept as defined by the appended claims and their equivalents.

What is claimed is:

1. A plasma processing apparatus comprising:
a process container that forms a process space to accommodate a target substrate;
a vacuum pump connected to an exhaust port of the process container to vacuum-exhaust gas from inside the process container;
an exhaust plate interposed between the process space and the exhaust port to rectify a flow of exhaust gas;
a first electrode and a second electrode disposed opposite each other within the process container, the first electrode being an upper electrode and the second electrode being a lower electrode and configured to support the target substrate through a mount face;
a first RF power supply configured to apply a first RF power to the second electrode;
a second RF power supply configured to apply a second RF power to the second electrode;
a DC power supply configured to apply a DC voltage to the first electrode;
a process gas supply source configured to supply a process gas into the process container;
a shield part covering an inner wall of the process container; and
a conductive member disposed within the process container and grounded to release through plasma a current caused by the DC voltage applied from the DC power supply to the first electrode, the conductive member being disposed above the second electrode as a ring around the first electrode, and the conductive member being supported by the process container or the shield part and protruding inward therefrom so as for the conductive member to be exposed to the plasma within the process space;
a switching mechanism configured to switch from a first state where the conductive member is connected to a ground potential portion to a second state where the conductive member is connected to a negative potential portion or set in floating; and
a control section configured to control the switching mechanism to perform switching between the first state and the second state in accordance with a preset control program,
wherein the switching mechanism includes a first switch to switch connection of the first electrode between a positive terminal and a negative terminal of the DC power supply, a second switch to switch the connection of the conductive member between the positive terminal and the negative terminal of the DC power supply, and a third switch to switch the positive terminal and the negative terminal of the DC power supply between a grounded state and a non-grounded state.

2. The plasma processing apparatus according to claim 1, wherein the switching mechanism forms the first state such that a negative terminal of the DC power supply is connected to the first electrode by the first switch, and the positive terminal of the DC power supply is grounded together with the conductive member by the second switch and the third switch.

3. The plasma processing apparatus according to claim 2, wherein the switching mechanism forms the second state such that the positive terminal of the DC power supply is connected to the first electrode by the first switch, the negative terminal of the DC power supply is connected to the conductive member by the second switch, and the positive terminal and the negative terminal of the DC power supply are not grounded by the third switch.

4. The plasma processing apparatus according to claim 1, wherein the first RF power is set for exciting plasma, and the second RF power is set for attracting ions.

5. The plasma processing apparatus according to claim 1, wherein the DC power supply is connected to the first electrode through an on/off switch and a filter configured to trap radio frequencies derived from the first and second RF powers.

6. The plasma processing apparatus according to claim 1, wherein the shield part is formed of a conductive internal body and an insulator covering the conductive internal body, and the conductive member is grounded through the conductive internal body of the shield part.

7. The plasma processing apparatus according to claim 1, wherein the conductive member includes a silicon-containing substance.

8. The plasma processing apparatus according to claim 1, wherein the conductive member protrudes toward inside the process space with a protruding length of 10 mm or more.

* * * * *